US012575281B2

(12) United States Patent (10) Patent No.: US 12,575,281 B2
Zhang et al. (45) Date of Patent: Mar. 10, 2026

(54) DISPLAY SUBSTRATE AND PREPARATION METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yunpeng Zhang, Beijing (CN); Yucheng Chan, Beijing (CN); Xiangfei He, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 500 days.

(21) Appl. No.: 18/033,561

(22) PCT Filed: May 27, 2022

(86) PCT No.: PCT/CN2022/095772
§ 371 (c)(1),
(2) Date: Apr. 25, 2023

(87) PCT Pub. No.: WO2023/226050
PCT Pub. Date: Nov. 30, 2023

(65) Prior Publication Data
US 2024/0381725 A1 Nov. 14, 2024

(51) Int. Cl.
*H10K 59/131* (2023.01)
*H10K 59/12* (2023.01)
*H10K 59/80* (2023.01)
*H10K 77/10* (2023.01)

(52) U.S. Cl.
CPC ..... *H10K 59/1315* (2023.02); *H10K 59/1201* (2023.02); *H10K 59/873* (2023.02); *H10K 77/111* (2023.02)

(58) Field of Classification Search
None
See application file for complete search history.

(56) References Cited

U.S. PATENT DOCUMENTS

2024/0251611 A1 * 7/2024 Ding .................... H10K 59/124

* cited by examiner

*Primary Examiner* — Kyoung Lee
(74) *Attorney, Agent, or Firm* — Ling Wu; Stephen Yang; Ling and Yang Intellectual Property

(57) ABSTRACT

Disclosed are a display substrate and a preparation method therefor, and a display apparatus. The display substrate includes a display region and a bezel region, the bezel region includes an upper bezel region and a side bezel region; on a plane perpendicular to the display substrate, the display substrate includes a base substrate and a drive circuit layer, the base substrate includes a base substrate conductive layer disposed between a first flexible layer and a second flexible layer, the base substrate conductive layer includes a first connection line, the drive circuit layer includes a data signal line and a second connection line, the second connection line is connected with the first connection line through a first lapping via, the data signal line is connected with the second connection line through a second lapping via, and the first lapping via is disposed in the upper bezel region.

20 Claims, 16 Drawing Sheets

DISPLAY SUBSTRATE AND PREPARATION METHOD THEREFOR, AND DISPLAY APPARATUS

CROSS-REFERENCE TO RELATED APPLICATION

The present application is a U.S. National Phase Entry of International Application No. PCT/CN2022/095772 having an international filing date of May 27, 2022. The entire contents of the above-identified application are hereby incorporated by reference.

TECHNICAL FIELD

The present disclosure relates to, but is not limited to, the field of display technologies, and particularly to a display substrate and a preparation method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (flexible display) in which an OLED or a QLED is used as a light emitting device and signal control is performed through a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate, including a display region, a bonding region located on a side of the display region in a second direction, and a bezel region located on another side of the display region. The bezel region at least includes an upper bezel region located on a side of the display region away from the bonding region and a side bezel region located on at least one side of the display region in a first direction, wherein the first direction intersects with the second direction. On a plane perpendicular to the display substrate, the display substrate includes a base substrate and a drive circuit layer disposed on the base substrate. The base substrate at least includes a first flexible layer, a second flexible layer, and a base substrate conductive layer disposed between the first flexible layer and the second flexible layer. The base substrate conductive layer at least includes a first connection line. The drive circuit layer at least includes a data signal line and a second connection line. The second connection line is connected with the first connection line through a first lapping via, the data signal line is connected with the second connection line through a second lapping via, and the first lapping via is disposed in the upper bezel region.

In an exemplary implementation mode, the upper bezel region includes a first encapsulation region and a first non-encapsulation region that are sequentially disposed along a direction away from the display region, and the first lapping via is disposed in the first non-encapsulation region.

In an exemplary implementation mode, the upper bezel region includes an isolation region and a crack dam region disposed sequentially along a direction away from the display region, wherein the isolation region is provided with an isolation dam, the crack dam region is provided with a crack dam, and the first lapping via is disposed between the isolation dam and the crack dam.

In an exemplary implementation mode, the drive circuit layer at least includes a shielding conductive layer, a first conductive layer, a second conductive layer, and a third conductive layer disposed sequentially on the base substrate, and the second connection line and the data signal line are disposed in different conductive layers.

In an exemplary implementation mode, the data signal line is disposed in the third conductive layer; the second connection line is disposed in the shielding conductive layer, or the second connection line is disposed in the first conductive layer, or the second connection line is disposed in the second conductive layer.

In an exemplary implementation mode, a first end of the first connection line is connected with a leading-out line of the bonding region, and a second end of the first connection line is connected with a first end of the second connection line through the first lapping via after the second end of the first connection line passes through the display region and extends to the upper bezel region.

In an exemplary implementation mode, an end of the first connection line away from the display region is provided with a first connection block, and an orthographic projection of the first lapping via on the base substrate is at least partially overlapped with an orthographic projection of the first connection block on the base substrate.

In an exemplary implementation mode, a first end of the second connection line is connected with the second end of the first connection line through the first lapping via, and a second end of the second connection line is connected with the data signal line through the second lapping via after the second end of the second connection line extends to the display region.

In an exemplary implementation mode, an end of the second connection line away from the display region is provided with a second connection block, and an orthographic projection of the first lapping via on the base substrate is at least partially overlapped with an orthographic projection of the second connection block on the base substrate.

In an exemplary implementation mode, an orthographic projection of the first lapping via on the base substrate is not overlapped with an orthographic projection of the second lapping via on the base substrate.

In an exemplary implementation mode, the bonding region at least includes a leading-out line region, a bending region, and a drive chip region disposed sequentially along a direction away from the display region. The base substrate conductive layer further includes a leading-out line, a first end of the leading-out line is connected with an integrated circuit of the drive chip region, and a second end of the leading-out line is connected with a first end of the first connection line after a second end of the leading-out line passes through the bending region and extends to the leading-out line region.

In an exemplary implementation mode, the leading-out line and the first connection line are connected with each other to form an integral structure.

In an exemplary implementation mode, the base substrate conductive layer further includes a first power supply connection line, the leading-out line region further includes a second power supply connection line and a power supply trace. A first end of the first power supply connection line is connected with a bonding pin of the drive chip region, a second end of the first power supply connection line is connected with the second power supply connection line through a third lapping via after the second end of the first power supply connection line passes through the bending region and extends to the leading-out line region, and the second power supply connection line is connected with the power supply trace through a fourth lapping via.

In an exemplary implementation mode, the leading-out line region includes a second encapsulation region and a second non-encapsulation region that are sequentially disposed along a direction away from the display region, and the third lapping via is disposed in the second non-encapsulation region.

In an exemplary implementation mode, an orthographic projection of the side bezel region on the base substrate is not overlapped with an orthographic projection of the base substrate conductive layer on the base substrate.

In another aspect, the present disclosure also provides a display apparatus, including the aforementioned display substrate.

In yet another aspect, the present disclosure also provides a preparation method of a display substrate. The display substrate includes a display region, a bonding region located on a side of the display region in a second direction, and a bezel region located on another side of the display region. The bezel region at least includes an upper bezel region located on a side of the display region away from the bonding region and a side bezel region located on at least one side of the display region in a first direction, wherein the first direction intersects with the second direction. The preparation method includes: forming a base substrate, wherein the base substrate at least includes a first flexible layer, a second flexible layer, and a base substrate conductive layer disposed between the first flexible layer and the second flexible layer, the base substrate conductive layer at least includes a first connection line; and forming a drive circuit layer on the base substrate, wherein the drive circuit layer at least includes a data signal line and a second connection line, the second connection line is connected with the first connection line through a first lapping via, the data signal line is connected with the second connection line through a second lapping via, and the first lapping via is disposed in the upper bezel region.

Other aspects may be understood upon reading and understanding drawings and the detailed description.

BRIEF DESCRIPTION OF DRAWINGS

The accompanying drawings are used for providing understanding of technical solutions of the present disclosure, and constitute a part of the specification. They are used for explaining the technical solutions of the present disclosure together with the embodiments of the present disclosure, but do not constitute a limitation on the technical solutions of the present disclosure.

Figure 1:
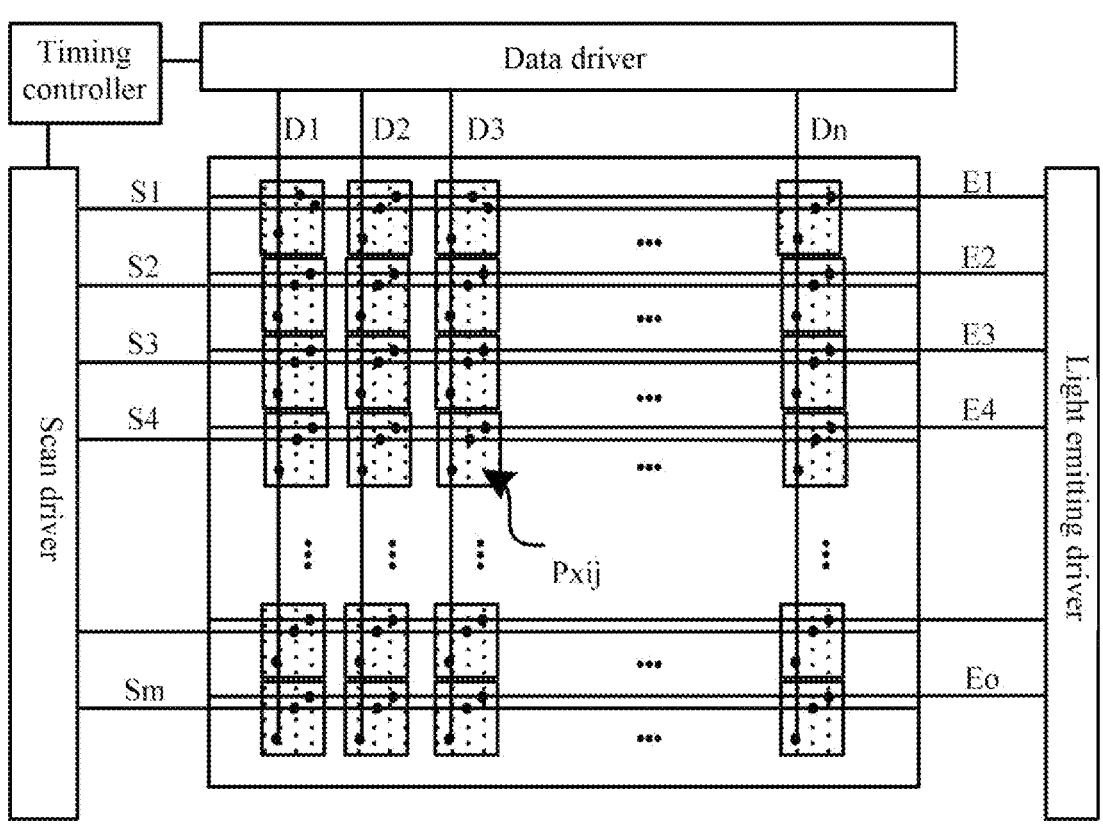
FIG. 1 is a schematic diagram of a structure of a display apparatus.

Reference signs are described as follows.

| | | |
|---|---|---|
| 10A-first flexible layer; | 10B-first barrier layer; | 10C-second flexible layer; |
| 10D-second barrier layer; | 11-first active layer; | 12-second active layer; |
| 13-third active layer; | 14-fourth active layer; | 15-fifth active layer; |
| 16-sixth active layer; | 17-seventh active layer; | 21-first scan signal line; |
| 22-second scan signal line; | 23-light emitting control line; | 24-first electrode plate; |
| 31-initial signal line; | 32-second electrode plate; | 33-electrode plate connection line; |
| 34-opening; | 41-first connection electrode; | 42-second connection electrode; |
| 43-third connection electrode; | 44-first power supply line; | 50-shielding electrode; |
| 60-data signal line; | 70-first connection line; | 71-first connection block; |
| 80-second connection line; | 81- second connection block; | 91-first insulation layer; |
| 92-second insulation layer; | 93-third insulation layer; | 94-fourth insulation layer; |
| 100-display region; | 101-base substrate; | 102-drive circuit layer; |
| 103-light emitting structure layer; | 104-encapsulation structure layer; | 200-bonding region; |
| 201-leading-out line region; | 202-bending region; | 203-drive chip region; |
| 210-bonding structure layer; | 220-leading-out line; | 221-bonding power supply trace; |
| 222-bonding lapping electrode; | 223-first connection line; | 224-second power supply connection line; |
| 300-bezel region; | 301-anode; | 302-pixel definition layer; |
| 303-organic emitting layer; | 304-cathode; | 310-upper bezel region; |
| 320-side bezel region; | 330-bezel structure layer; | 331-first gate circuit; |
| 332-second gate circuit; | 333-bezel power supply trace; | 334-bezel lapping electrode; |
| 401-first encapsulation layer; | 402-second encapsulation layer; | 403-third encapsulation layer; |
| 410-first isolation dam; | 420-second isolation dam. | |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

Scales of the drawings in the present disclosure may be used as a reference in an actual process, but are not limited thereto. For example, a width-length ratio of a channel, a thickness and a pitch of each film layer, and a width and a pitch of each signal line may be adjusted according to actual needs. A quantity of pixels in a display substrate and a quantity of sub-pixels in each pixel are not limited to numbers shown in the drawings. The drawings described in the present disclosure are structural schematic diagrams only, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or an electrical connection; it may be a direct mutual connection, or an indirect connection through middleware, or internal communication between two elements. Those of ordinary skill in the art may understand specific meanings of these terms in the present disclosure according to specific situations.

In the specification, a transistor refers to an element which includes at least three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, a first electrode may be a source electrode, and a second electrode may be a drain electrode. In a case that transistors with opposite polarities are used, in a case that a direction of a current is changed during operation of a circuit, or the like, functions of the "source electrode" and the "drain electrode" are sometimes interchangeable. Therefore, the "source electrode" and the "drain electrode", as well as a "source terminal" and a "drain terminal", are interchangeable in the specification.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, and other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc. In the present disclosure, "about" refers to that a boundary is not defined so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, wherein i and j may be natural numbers. At least one sub-pixel Pxij may include a circuit unit and a light emitting device connected with the circuit unit, the circuit unit may at least include a pixel drive circuit, and the pixel drive circuit is connected with a scan signal line, a data signal line, and a light emitting signal line, respectively. In an exemplary implementation mode, the timing controller may provide a gray scale value and a control signal, which are suitable for a specification of the data driver, to the data driver, may provide a clock signal, and a scan start signal, etc., which are suitable for a specification of the scan driver, to the scan driver, and may provide a clock signal, and an emission stop signal, etc., which are suitable for a specification of the light emitting driver, to the light emitting driver. The data driver may generate a data voltage to be provided to the data signal lines D1, D2, D3, . . . , and Dn by using the gray scale value and the control signal that are received from the timing controller. For example, the data driver may sample the gray scale value by using the clock signal and apply a data voltage corresponding to the gray scale value to the data signal lines D1 to Dn by taking a pixel row as a unit, wherein n may be a natural number. The scan driver may receive the clock signal, and the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which a scan start signal provided in a form of an on-level pulse is transmitted to a next-stage circuit sequentially under control of the clock signal, wherein m may be a natural number. The light emitting driver may receive a clock signal, and an emission stop signal, etc., from the timing controller to generate an emission signal to be provided to the light emitting signal lines E1, E2, E3, . . . , and Eo. For example, the light emitting driver may provide an emission signal with an off-level pulse to the light emitting signal lines E1 to Eo sequentially. For example, the light emitting driver may be constructed in a form of a shift register and may generate an emission signal in a manner in which an emission stop signal provided in a form of an off-level pulse is transmitted to a next-stage circuit sequentially under control of the clock signal, wherein o may be a natural number.

Figure 2:
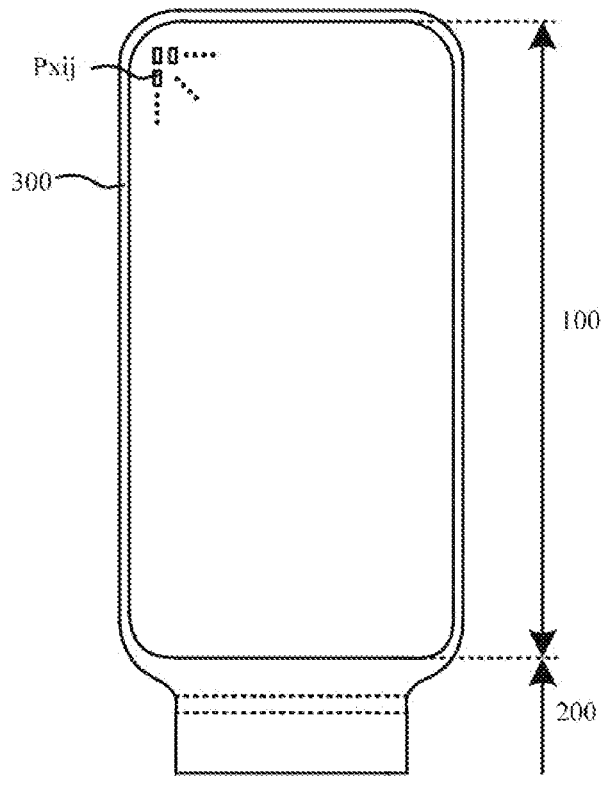
FIG. 2 is a schematic diagram of a structure of a display substrate.

FIG. 2 is a schematic diagram of a structure of a display substrate. As shown in FIG. 2, the display substrate may include a display region 100, a bonding region 200 located on a side of the display region 100, and a bezel region 300 located on another side of the display region 100. In an exemplary implementation mode, the display region 100 may be a plat region including a plurality of sub-pixels Pxij that constitute a pixel array, the plurality of sub-pixels Pxij are configured to display a dynamic picture or a static image, and the display region 100 may be referred to as an Active Area (AA). In an exemplary implementation mode, the display substrate may be deformable, e.g., may be curled, bent, folded, or rolled.

In an exemplary implementation mode, the bonding region 200 may include a fan-out region, a bending region, a drive chip region, and a bonding pin region that are disposed sequentially along a direction away from the display region 100. The fan-out region is connected to the display region 100 and may at least include a plurality of data connection lines configured to connect data signal lines of the display region in a fan-out trace manner. The bending region is connected to the fan-out region and may include a composite insulation layer provided with a groove, and is configured to enable the bonding region to be bent to a back surface of the display region. The drive chip region may at least include an Integrated Circuit (IC for short), and is configured to be connected with multiple data connection lines. The bonding pin region may at least include a plurality of bonding pads, and is configured to be bonded to and connected with an external Flexible Printed Circuit (FPC for short).

In an exemplary implementation mode, the bezel region 300 may include a circuit region, a power supply line region, a crack dam region, and a cutting region which are sequentially disposed along the direction away from the display region 100. The circuit region is connected to the display region 100 and may at least include a gate drive circuit which is connected with a first scan line, a second scan line, and a light emitting control line of a pixel drive circuit in the display region 100. The power supply line region is connected to the circuit region and may at least include a bezel power supply trace that extends along a direction parallel to an edge of the display region and is connected with a cathode in the display region 100. The crack dam region is connected to the power supply line region and may at least include a plurality of cracks disposed on the composite insulation layer. The cutting region is connected to the crack dam region and may at least include a cutting groove disposed on the composite insulation layer, and the cutting groove is configured such that a cutting device respectively cuts along the cutting groove after preparation of all film layers of the display substrate is completed.

In an exemplary implementation mode, the fan-out region in the bonding region 200 and the power supply line region in the bezel region 300 may be provided with a first isolation dam and a second isolation dam, the first isolation dam and the second isolation dam may extend along the direction parallel to the edge of the display region 100, thus forming an annular structure surrounding the display region 100, wherein the edge of the display region is an edge on a side of the display region, the bonding region, or the bezel region.

Figure 3:
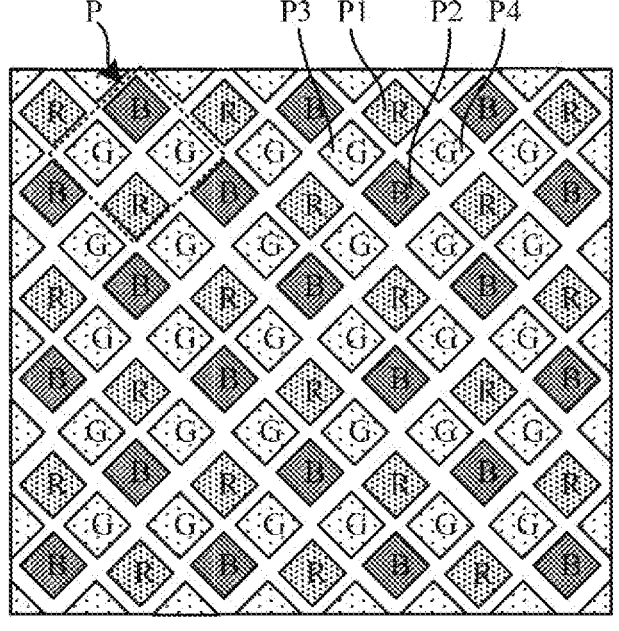
FIG. 3 is a schematic diagram of a planar structure of a display region in a display substrate.

FIG. 3 is a schematic diagram of a planar structure of a display region in a display substrate. As shown in FIG. 3, the display substrate may include a plurality of pixel units P arranged in a matrix. At least one pixel unit P includes a first sub-pixel P1 emitting light of a first color, a second sub-pixel P2 emitting light of a second color, and a third sub-pixel P3 and a fourth sub-pixel P4 emitting light of a third color. Each sub-pixel may include a drive circuit and a light emitting device, the circuit unit may at least include a pixel drive circuit which is connected with a scan signal line, a data signal line, and a light emitting signal line respectively. The pixel drive circuit is configured to receive a data voltage transmitted by the data signal line and output a corresponding current to the light emitting device under control of the scan signal line and the light emitting signal line. The light emitting device in each sub-pixel is connected with a pixel drive circuit of a sub-pixel where the light emitting device is located, and is configured to emit light with corresponding brightness in response to a current output by the pixel drive circuit of the sub-pixel with which the light emitting device is connected.

In an exemplary implementation mode, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation mode, a shape of a sub-pixel may be a rectangle, a diamond, a pentagon, or a hexagon. The four sub-pixels may be arranged in a manner of diamond to form an RGBG pixel arrangement. In other exemplary implementation modes, the four sub-pixels may be arranged side by side horizontally, side by side vertically, or in a manner to form a square, which is not limited in the present disclosure.

In an exemplary implementation mode, a pixel unit may include three sub-pixels, the three sub-pixels may be arranged side by side horizontally, side by side vertically, or in a manner like a Chinese character "品", which is not limited in the present disclosure.

Figure 4:
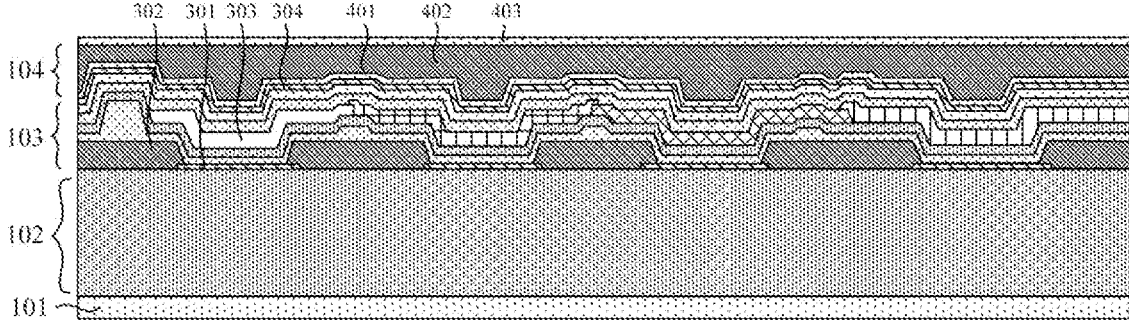
FIG. 4 is a schematic diagram of a sectional structure of a display region in a display substrate.

FIG. 4 is a schematic diagram of a sectional structure of a display region in a display substrate, illustrating a structure of four sub-pixels in the display region. As shown in FIG. 4, on a plane perpendicular to the display substrate, the display substrate may include a drive circuit layer 102 disposed on a base substrate 101, a light emitting structure layer 103 disposed on a side of the drive circuit layer 102 away from the base substrate 101, and an encapsulation structure layer 104 disposed on a side of the light emitting structure layer 103 away from the base substrate 101. In some possible implementation modes, the display substrate may include another film layer, such as a touch structure layer, which is not limited in the present disclosure.

In an exemplary implementation mode, the base substrate 101 may be a flexible base substrate, or may be a rigid base substrate. The drive circuit layer 102 may include a plurality of circuit units, and a circuit unit may at least include a pixel drive circuit. The light emitting structure layer 103 may at least include a plurality of light emitting devices; a light emitting device may at least include an anode 301, an organic emitting layer 303, and a cathode 304. The organic emitting layer 303 emits light of a corresponding color under drive of the anode 301 and the cathode 304. The light emitting structure layer 103 may further include a pixel definition layer 302 covering the anode 301, a pixel opening is provided on the pixel definition layer 302, and the pixel opening exposes a surface of the anode 301. The encapsulation structure layer 104 may include a first encapsulation layer 401, a second encapsulation layer 402, and a third encapsulation layer 403 that are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 to form a stacked layer structure of an inorganic material/an organic material/an inorganic material, which may ensure that external water and oxygen cannot enter the emitting structure layer 103.

In an exemplary implementation mode, the organic emitting layer may include an Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, one or more layers of hole injection layers, hole transport layers, electron block layers, hole block layers, electron transport layers, and electron injection layers of all sub-pixels may be a common layer connected together. Emitting layers of adjacent sub-pixels may be overlapped slightly, or may be mutually isolated.

Figure 5:
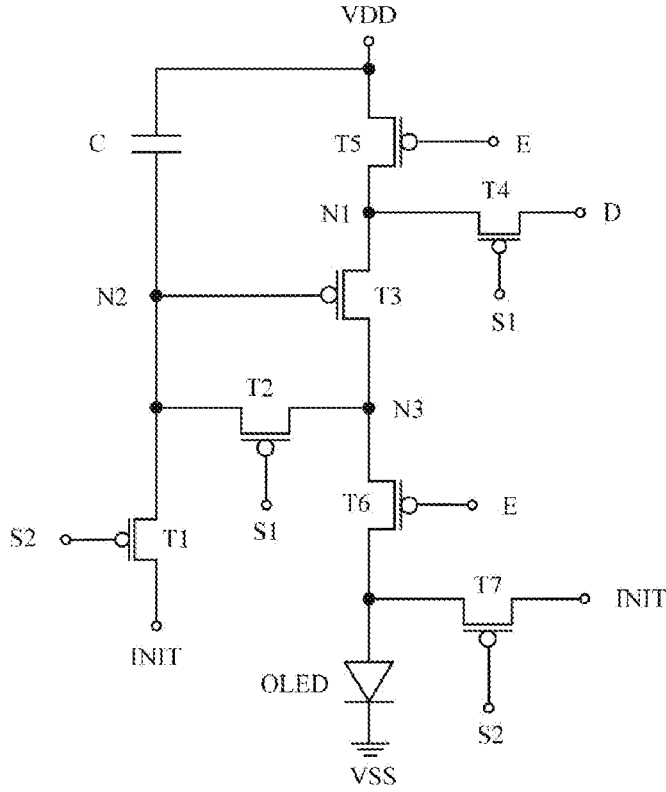
FIG. 5 is a schematic diagram of an equivalent circuit of a pixel drive circuit.

FIG. 5 is a schematic diagram of an equivalent circuit of a pixel drive circuit. In an exemplary implementation mode, the pixel drive circuit may have a structure of 3T1C, 4T1C, 5T1C, 5T2C, 6T1C, 7T1C, or 8T1C. As shown in FIG. 5, the pixel drive circuit may include seven transistors (a first transistor T1 to a seventh transistor T7), one storage capacitor C. The pixel drive circuit is connected with seven signal lines (a data signal line D, a first scan signal line S1, a second scan signal line S2, a light emitting signal line E, an initial signal line INIT, a first power supply line VDD, and a second power supply line VSS) respectively.

In an exemplary implementation mode, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation mode, a first end of the storage capacitor C is connected with the first power supply line VDD, and the second end of the storage capacitor C is connected with the second node N2, i.e., the second end of the storage capacitor C is connected with the control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initial voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with the second electrode of the third transistor T3.

The control electrode of the third transistor T3 is connected with the second node N2, i.e., the control electrode of the third transistor T3 is connected with the second end of the storage capacitor C, the first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and the second electrode of the fourth transistor T4 is connected with the first node N1. The fourth transistor T4 may be referred to as a switching transistor, and a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and the second electrode of the fifth transistor T5 is connected with the first node N1. A control electrode of the sixth transistor T6 is connected with the light emitting signal line E, the first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the second scan signal line S2, a first electrode of the seventh transistor T7 is connected with the initial signal line INIT, and a second electrode of the seventh transistor T7 is connected with the first electrode of the light emitting device. When a scan signal with an on-level is applied to the second scan signal line S2, the seventh transistor T7 transmits an initial voltage to the first electrode of the light emitting device so as to initialize a charge amount accumulated in the first electrode of the light emitting device or release a charge amount accumulated in the first electrode of the light emitting device.

In an exemplary implementation mode, the light emitting device may be an OLED including a first electrode (anode), an organic emitting layer, and a second electrode (cathode), which are stacked, or may be a QLED including a first electrode (anode), a quantum dot emitting layer, and a second electrode (cathode), which are stacked.

In an exemplary implementation mode, a second electrode of the light emitting device is connected with the second power supply line VSS, a signal of the second power supply line VSS is a low-level signal continuously provided, and a signal of the first power supply line VDD is a high-level signal continuously provided.

In an exemplary implementation mode, the first transistor T1 to the seventh transistor T7 may be P-type transistors, or may be N-type transistors. Use of a same type of transistors in a pixel drive circuit may simplify a process flow, reduce process difficulties of a display panel, and improve a yield of products. In some possible implementation modes, the first transistor T1 to the seventh transistor T7 may include a P-type transistor and an N-type transistor.

In an exemplary implementation mode, for the first transistor T1 to the seventh transistor T7, low temperature poly silicon thin film transistors may be adopted, or oxide thin film transistors may be adopted, or a low temperature poly silicon thin film transistor and an oxide thin film transistor may be adopted. An active layer of a low temperature poly silicon thin film transistor may be made of Low Temperature Poly Silicon (LTPS for short), and an active layer of an oxide thin film transistor may be made of an oxide semiconductor (Oxide). The low temperature poly silicon thin film transistor has advantages such as a high migration rate and fast charging. The oxide thin film transistor has advantages such as low leakage current. The low temperature poly silicon thin film transistor and the oxide thin film transistor are integrated on one display substrate to form a Low Temperature Polycrystalline Oxide (LTPO for short) display substrate, so that advantages of the low temperature poly silicon thin film transistor and the oxide thin film transistor may be utilized, low-frequency drive may be achieved, power consumption may be reduced, and display quality may be improved.

Taking a case where seven transistors are all P-type transistors as an example, a working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 and the seventh transistor T7 are turned on. The first transistor T1 is turned on such that an initial voltage of the initial signal line INIT is provided to a second node N2 to initialize the storage capacitor C and clear an original data voltage in the storage capacitor. The seventh transistor T7 is turned on, so that the initial voltage of the initial signal line INIT is provided to a first electrode of an OLED to initialize (reset) the first electrode of the OLED and clear a pre-stored voltage therein, thereby completing initialization. The signals of the first scan signal line S1 and the light emitting signal line E are the high-level signals, so that the second transistor T2, the fourth transistor T4, the fifth transistor T5, and the sixth transistor T6 are turned off. The OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the second end of the storage capacitor C is at a low level, so the third transistor T3 is turned on. The signal of the first scan signal line S1 is the low-level signal, so that the second transistor T2 and the fourth transistor T4 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd-|Vth|, wherein Vd is the data voltage output by the data signal line D, and Vth is the threshold voltage of the third transistor T3. A signal of the second scan signal line S2 is a high-level signal, so that the first transistor T1 and the seventh transistor T7 are turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and the first electrode of the third transistor T3. The voltage of the second node N2 is Vdata-| Vth|, so the drive current of the third transistor T3 is as follows.

$$I = K*(Vgs-Vth)^2 = K*[(Vdd - Vd + |Vth|)-Vth]^2 = K*[(Vdd-Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With development of OLED display technologies, consumers have higher and higher requirements for a display effect of a display product. An extremely narrow bezel has become a new trend in development of display products. Therefore, bezel narrowing or even a bezel-less design has attracted more and more attention in a design of an OLED display product. In a display substrate, a data fan-out line is disposed in a fan-out region of a bonding region. Since a width of the fan-out region is smaller than that of a display region, the data fan-out line can be introduced into a wider display region through a fan-out tracing manner. The larger the width difference between the display region and the bonding region, the more oblique fan-out lines in a fan-shaped region, and the larger the space occupied by the fan-shaped region. In addition, with gradual increase of a resolution of a display screen, an occupied width of a fan-out line will gradually increase, which makes it difficult to narrow a lower bezel, and the lower bezel is always maintained at about 2.0 mm.

An exemplary embodiment of the present disclosure provides a display substrate, and structure in which a data connection line is located in a display region (Fan-out in AA, abbreviated as FIAA) is adopted. Ends of a plurality of data connection lines are correspondingly connected with a plurality of data signal lines in the display region, the other ends of the plurality of data connection lines extend to a bonding region and are correspondingly connected with an integrated circuit in the bonding region. Since the bonding region does not need to be provided with a fan-shaped oblique line, a width of a fan-out region is reduced, and a width of a lower bezel is effectively reduced.

In an exemplary implementation mode, on a plane parallel to the display substrate, the display substrate may at least include the display region, the bonding region located on a side of the display region, and a bezel region located on another side of the display region. The bezel region may include an upper bezel region located on a side of the display region away from the bonding region and side bezel regions located on two sides of the display region.

In an exemplary implementation mode, on a plane perpendicular to the display substrate, the display substrate layer may include a drive circuit layer disposed on a base substrate, a light emitting structure layer disposed on a side of the drive circuit layer away from the base substrate, and an encapsulation structure layer disposed on a side of the light emitting structure layer away from the base substrate.

In an exemplary implementation mode, the base substrate may at least include a first flexible layer, a second flexible layer, and a base substrate conductive layer disposed between the first flexible layer and the second flexible layer. The drive circuit layer of the display region may include a plurality of circuit units constituting a plurality of unit rows and a plurality of unit columns, and at least one circuit unit may include a pixel drive circuit configured to output a corresponding current to a light emitting device connected with the pixel drive circuit. The light emitting structure layer of the display region may include a plurality of sub-pixels constituting a pixel array, at least one sub-pixel may include a light emitting device connected with a pixel drive circuit of a corresponding circuit unit, and the light emitting device is configured to emit light with corresponding brightness in response to a current output by the pixel drive circuit connected with the light emitting device.

In an exemplary implementation mode, sub-pixels mentioned in the present disclosure refer to regions divided according to light emitting devices, and circuit units mentioned in the present disclosure refer to regions divided according to pixel drive circuits. In an exemplary implementation mode, a position of an orthographic projection of a sub-pixel on the base substrate may correspond to a position of an orthographic projection of a circuit unit on the base substrate, or a position of an orthographic projection of a sub-pixel on the base substrate may not correspond to a position of an orthographic projection of a circuit unit on the base substrate.

In an exemplary implementation mode, the display substrate according to an exemplary embodiment of the present disclosure may include a display region, a bonding region located on a side of the display region in a second direction, and a bezel region located on another side of the display region. The bezel region at least includes an upper bezel region located on a side of the display region away from the bonding region and a side bezel region located on least one side of the display region in a first direction, wherein the first direction intersects with the second direction. On a plane perpendicular to the display substrate, the display substrate includes a base substrate and a drive circuit layer disposed on the base substrate. The base substrate at least includes a first flexible layer, a second flexible layer, and a base substrate conductive layer disposed between the first flexible layer and the second flexible layer. The base substrate conductive layer at least includes a first connection line. The drive circuit layer at least includes a second connection line and a data signal line. The second connection line is connected with the first connection line through a first lapping via, the data signal line is connected with the second connection line through a second lapping via, and the first lapping via is disposed in the upper bezel region.

In an exemplary implementation mode, the upper bezel region includes a first encapsulation region and a first non-encapsulation region that are sequentially disposed along a direction away from the display region, and the first lapping via is disposed in the first non-encapsulation region.

In an exemplary implementation mode, the upper bezel region includes an isolation region and a crack dam region disposed in sequence along a direction away from the display region, wherein the isolation region is provided with an isolation dam, the crack dam region is provided with a crack dam, and the first lapping via is disposed between the isolation dam and the crack dam.

In an exemplary implementation mode, the bonding region at least includes a leading-out line region, a bending region, and a drive chip region disposed sequentially along a direction away from the display region. The base substrate conductive layer further includes a leading-out line, a first end of the leading-out line is connected with an integrated circuit of the drive chip region, and a second end of the leading-out line is connected with a first end of the first connection line after a second end of the leading-out line passes through the bending region and extends to the leading-out line region.

In an exemplary implementation mode, the base substrate conductive layer further includes a first power supply connection line, the leading-out line region further includes a second power supply connection line and a power supply trace. A first end of the first power supply connection line is connected with a bonding pin of the drive chip region, a second end of the first power supply connection line is connected with the second power supply connection line through a third lapping via after a second end of the first power supply connection line passes through the bending region and extends to the leading-out line region, and the second power supply connection line is connected with the power supply trace through a fourth lapping via.

In an exemplary implementation mode, the leading-out line region includes a second encapsulation region and a second non-encapsulation region that are sequentially disposed along a direction away from the display region, and the third lapping via is disposed in the second non-encapsulation region.

In an exemplary implementation mode, an orthographic projection of the side bezel region on the base substrate is not overlapped with an orthographic projection of the base substrate conductive layer on the base substrate.

In an exemplary implementation mode, the drive circuit layer at least includes a shielding conductive layer, a first conductive layer, a second conductive layer, and a third conductive layer disposed in sequence on the base substrate, and the second connection line and the data signal line are disposed in different conductive layers.

In an exemplary implementation mode, the data signal line is disposed in the third conductive layer; the second connection line is disposed in the shielding conductive layer, or the second connection line is disposed in the first conductive layer, or the second connection line is disposed in the second conductive layer.

Figure 6A:
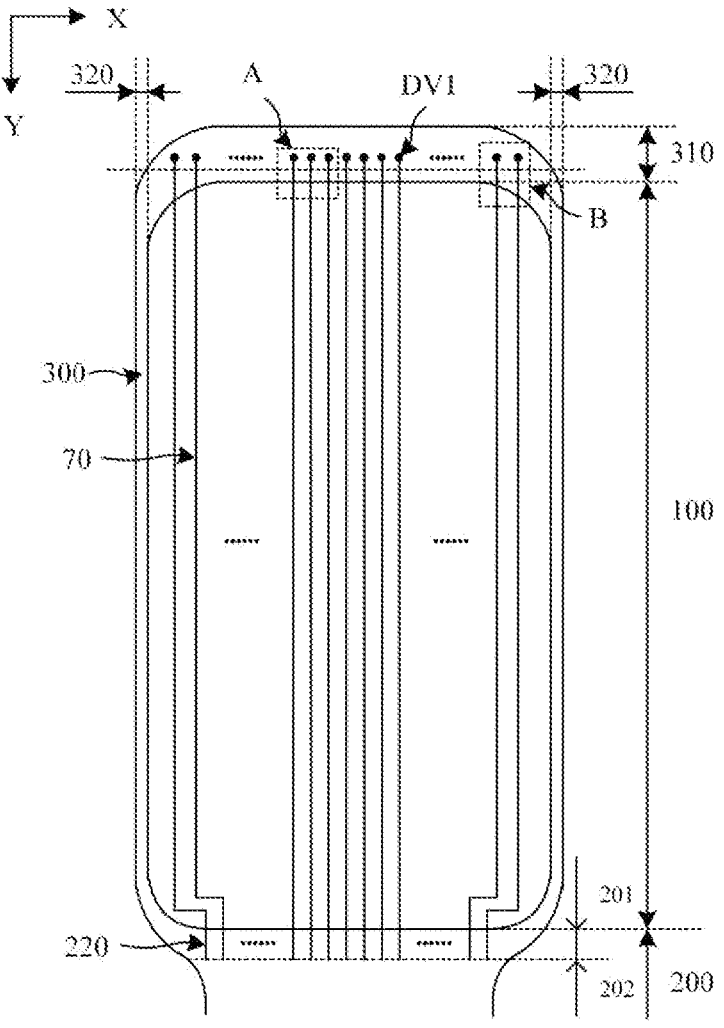
FIG. 6a and FIG. 6b are schematic diagrams of a planar structure of a display substrate according to an exemplary embodiment of the present disclosure.
Figure 6B:
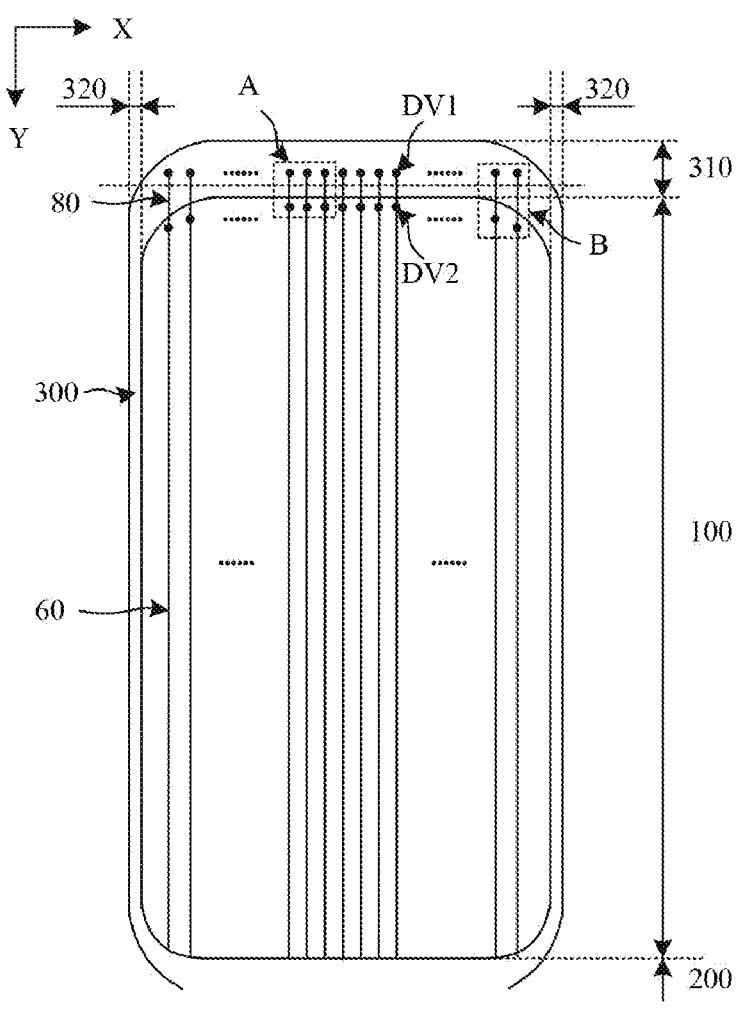

FIG. 6a and FIG. 6b are schematic diagrams of a planar structure of a display substrate according to an exemplary embodiment of the present disclosure, a FIAA structure is adopted for a data connection line in the display substrate, FIG. 6a illustrates a structure of a first connection line, and FIG. 6b illustrates a structure of a data signal line and a second connection line. As shown in FIG. 6a and FIG. 6b, on a plane parallel to the display substrate, the display substrate may include a display region 100, a bonding region 200 located on a side of the display region 100 in a second direction Y, and a bezel region 300 located on another side of the display region 100.

In an exemplary implementation mode, the display region 100 may at least include a plurality of circuit units constituting a plurality of unit rows and a plurality of unit columns, and at least one circuit unit may at least include a pixel drive circuit. The bonding region 200 may at least include a leading-out line region 201 and a bending region 202 that are sequentially disposed along a direction away from the display region 100. The leading-out line region 201 may include a plurality of leading-out lines 220, a first end of a leading-out line 220 is connected with an integrated circuit in the bonding region 200, and a second end of the leading-out line 220 passes through the bending region 202 and extends to the leading-out line region 201. The bezel region 300 may include an upper bezel region 310 located on a side of the display region 100 in a direction opposite to the second direction Y (the display region 100 away from the bonding region 200) and a side bezel region 320 located on two sides of the display region 100 in a first direction X.

In an exemplary implementation mode, a plurality of circuit units sequentially disposed along the first direction X may be referred to as a unit row, and a plurality of circuit units sequentially disposed along the second direction Y may be referred to as a unit column. The plurality of unit rows and the plurality of unit columns constitute an array of circuit units arranged in an array, and the first direction X intersects with the second direction Y. In an exemplary implementation mode, the second direction Y may be an extension direction of the data signal line (vertical direction), and the first direction X may be perpendicular to the second direction Y (horizontal direction).

In an exemplary implementation mode, the display region may include a plurality of data signal lines 60, and the data signal lines 60 may be in a line shape of which a main body portion extends along the second direction Y, and the plurality of data signal lines 60 are sequentially disposed at a set interval in the first direction X, each data signal line 60 is connected with a pixel drive circuit of a plurality of circuit units in one unit column.

In an exemplary implementation mode, the display substrate may further include a plurality of first connection lines 70 and second connection lines 80, and a first connection line 70 and a second connection line 80 constitute a data connection line. First ends of the plurality of first connection lines 70 are correspondingly connected with the plurality of leading-out lines 220 of the leading-out line region 201, and second ends of the plurality of first connection lines 70 are correspondingly connected with first ends of the plurality of second connection lines 80 through a first lapping via DV1 after passing through the display region 100 from the leading-out line region 201 and extending to the upper bezel region 310. Second ends of the plurality of second connection lines 80 are correspondingly connected with the plurality of data signal lines 60 through a second lapping via DV2 after extending from the upper bezel region 310 to the display region 100, so as to form a data connection line structure in which the first lapping via DV1 is disposed in the upper bezel region 310 and the second lapping via DV2 is disposed in the display region 100.

In an exemplary implementation mode, since a leading-out line 220 is connected with an integrated circuit in the bonding region 200, a first connection line 70 is connected with the leading-out line 220, a second connection line 80 is connected with the first connection line 70, and a data signal line 60 is connected with the second connection line 80, so that the data signal line 60 in the display region is connected with the integrated circuit in the bonding region through the second connection line 80, the first connection line 70, and the leading-out line 220, thus achieving that the integrated circuit provides a data signal to the data signal line 60. Since the bonding region does not need to be provided with a fan-shaped oblique line, a width of a fan-out region is reduced, and a width of a lower bezel may be effectively reduced.

In the present disclosure, "A extends along a B direction" means that A may include a main portion and a secondary portion connected with the main portion, the main portion is a line, a line segment, or a strip-shaped body, the main portion extends along the B direction, and a length of the main portion extending along the B direction is greater than a length of the secondary portion extending along another direction. In following description, "A extends along a B direction" means "a main body portion of A extends along a B direction". In an exemplary implementation mode, a second direction Y may be a direction pointing to a bonding region from a display region, and an opposite direction of the second direction Y may be a direction pointing to the display region from the bonding region.

In an exemplary implementation mode, a quantity of data connection lines and a quantity of data signal lines may be the same, or a quantity of data connection lines may be less than a quantity of data signal lines, which is not limited in the present disclosure.

Figure 7A:
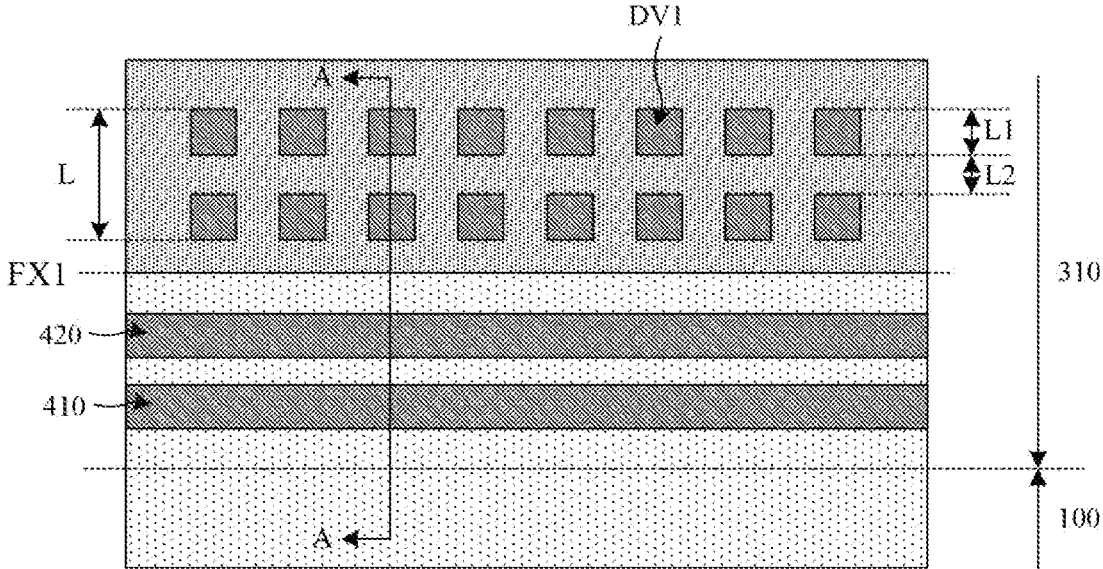
FIG. 7a and FIG. 7b are schematic diagrams of a structure of an upper bezel region according to an exemplary embodiment of the present disclosure.
Figure 7B:
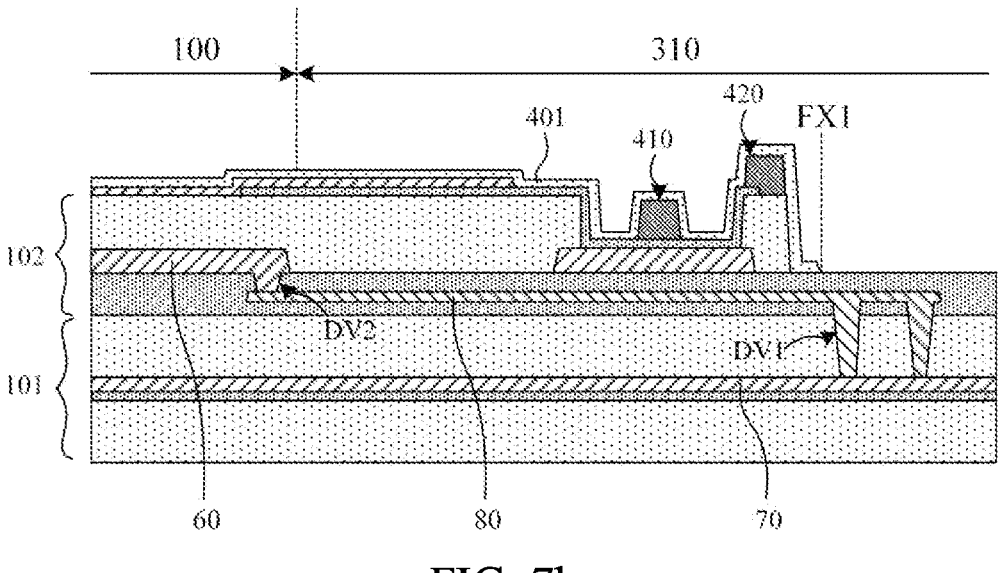

FIG. 7a is a schematic diagram of a structure of an upper bezel region according to an exemplary embodiment of the present disclosure, is an enlarged view of a region A in FIG. 6a and FIG. 6b, and FIG. 7b is a sectional view taken along a direction A-A in FIG. 7a. As shown in FIG. 7a and FIG. 7b, on a plane parallel to the display substrate, the upper bezel region 310 of the bezel region 300 may be located on a side of the display region 100 away from the bonding region 200. The upper bezel region 310 may include a first encapsulation region and a first non-encapsulation region divided by a first encapsulation line FX1. The first encapsulation line FX1 may be a boundary of an encapsulation structure layer covering the upper bezel region 310. The first encapsulation line FX1 may divide the upper bezel region 310 into the first encapsulation region and the first non-encapsulation region disposed sequentially along a direction away from the display region 100. A side of the first encapsulation line FX1 close to the display region 100 is the first encapsulation region, and a side of the first encapsulation line FX1 away from the display region 100 is the first non-encapsulation region. In an exemplary implementation mode, the first encapsulation region may be provided with a first isolation dam 410 and a second isolation dam 420. The first non-encapsulation region may include a crack dam region and a cutting region disposed in sequence along the direction away from the display region 100. The crack dam region is connected to the first encapsulation region and may at least include a plurality of cracks disposed on a composite insulation layer to form a crack dam. The crack dam is configured to reduce stress on the display region 100 in a cutting process and intercept transmission of a crack to a direction of the display region 100. The cutting region is connected to the crack dam region and may at least include a cutting groove disposed on the composite insulation layer, and the cutting groove is configured such that a cutting device respectively cuts along the cutting groove after preparation of all film layers of the display substrate is completed.

In an exemplary implementation mode, a plurality of first lapping vias DV1 may be disposed in the isolation region, that is, the plurality of first lapping vias DV1 may be disposed on a side of the first encapsulation line FX away from the display region 100.

In an exemplary implementation mode, a plurality of first lapping vias DV1 may be disposed between the second isolation dam and the crack dam.

In an exemplary implementation mode, the first connection line 70 may be connected with the second connection line 80 through a plurality of first lapping vias DV1 to reduce a lapping resistance and improve connection reliability. The plurality of first lapping vias DV1 may be disposed in sequence along the direction away from the display region.

In an exemplary implementation mode, one first connection line 70 may be connected with one second connection line 80 through two first lapping vias DV1. A length L1 of a first lapping via DV1 may be about 4 μm to 8 μm, a pitch L2 between the two first lapping vias DV1 may be about 8 μm to 12 μm, the length L1 may be a size of the first lapping via in the second direction Y, and the pitch L2 may be a distance between edges of the two first lapping vias. For example, a shape of the first lapping via DV1 may be a rectangle, the length L1 of the first lapping via DV1 may be about 6 μm, and the pitch L2 between the two first lapping vias DV1 may be about 10 μm.

In an exemplary implementation mode, an occupied length L of the plurality of first lapping vias DV1 along the direction away from the display region may be about 20 μm to 50 μm, and the occupied length L may be a maximum distance between an edge of the first lapping via on a side close to the display region and an edge of the first lapping via on a side away from the display region.

In an exemplary implementation mode, on a plane parallel to the display substrate, a shape of the first lapping via DV1 may include any one or more of following: a triangle, a rectangle, a pentagon, a hexagon, a circle, and an ellipse.

In an exemplary implementation mode, on a plane perpendicular to the display substrate, the display substrate may include a base substrate 101 and a drive circuit layer 102 disposed on the base substrate 101. The base substrate 101 may at least include a first connection line 70, and the drive circuit layer 102 may at least include a data signal line 60 and a second connection line 80, the first connection line 70 is connected with the second connection line 80 through a first lapping via DV1, and the second connection line 80 is connected with the data signal line 60 through a second lapping via DV2.

In an exemplary implementation mode, the upper bezel region 310 may further include an isolation structure layer disposed on a side of the drive circuit layer 102 away from the base substrate. The isolation structure layer may at least include a first isolation dam 410, a second isolation dam 420, and a first encapsulation layer 401. The first isolation dam 410 and the second isolation dam 420 may be disposed on a side of the first encapsulation line FX close to the display region 100, the first encapsulation layer 401 covers the first isolation dam 410 and the second isolation dam 420, and a boundary of the first encapsulation layer 401 away from the display region 100 forms the first encapsulation line FX, which may be referred to as a Chemical Vapor Deposition (CVD) boundary.

In an exemplary implementation mode, the first connection line 70 may be disposed in a base substrate conductive layer of the base substrate 101, the data signal line 60 may be disposed in a Source-Drain metal layer (SD) of the drive circuit layer 102, the second connection line 80 may be disposed in a Shielding conductive Layer (SHL) of the drive circuit layer 102, or the second connection line 80 may be disposed in a first gate metal layer (GATE1) of the drive circuit layer 102, or the second connection line 80 may be disposed in a second gate metal layer (GATE2) of the drive circuit layer 102.

Figure 8:
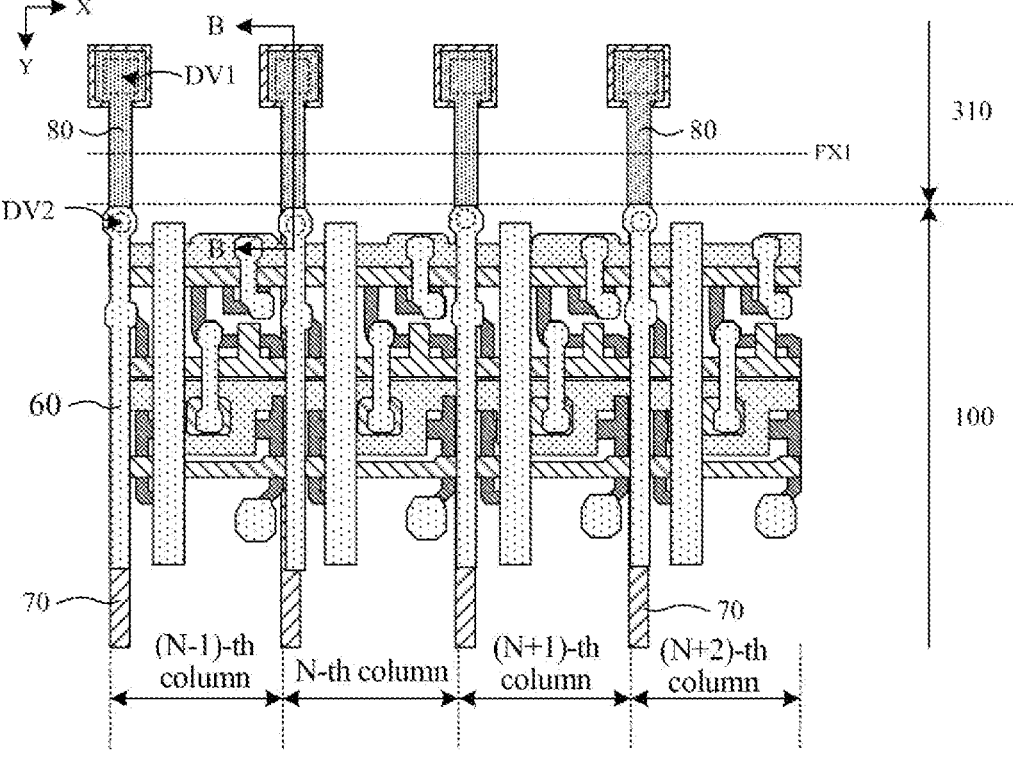
FIG. 8 is a schematic diagram of a planar structure of a data connection line according to an exemplary embodiment of the present disclosure.

FIG. 8 is a schematic diagram of a planar structure of a data connection line according to an exemplary embodiment of the present disclosure, and is an enlarged view of a region B in FIG. 6a and FIG. 6b. As shown in FIG. 8, on a plane parallel to the display substrate, the display region 100 may include a plurality of circuit units constituting a plurality of unit rows and a plurality of unit columns. The upper bezel region 310 may include a first encapsulation region and a first non-encapsulation region divided by a first encapsulation line FX1, the first encapsulation region and the first non-encapsulation region may be disposed in sequence along a direction away from the display region 100. A side of the first encapsulation line FX1 close to the display region 100 is the first encapsulation region, and a side of the first encapsulation line FX1 away from the display region 100 is the first non-encapsulation region.

In an exemplary implementation mode, at least one circuit unit may include a pixel drive circuit, the pixel drive circuit may at least include a plurality of transistors and a storage capacitor, and a data signal line 60 is connected with a plurality of pixel drive circuits of one unit column, the data signal line 60 is configured to provide a data signal to the pixel drive circuits.

In an exemplary implementation mode, the display region 100 may at least include a first connection line 70, the upper bezel region 310 may at least include a second connection line 80, a first lapping via DV1 connecting the first connection line 70 and the second connection line 80 may be disposed in the upper bezel region 310, and the first lapping via DV1 may be disposed on a side of the first encapsulation line FX1 away from the display region 100, and a second lapping via DV2 connecting the second connection line 80 and the data signal line 60 may be disposed in the display region 100, or the second lapping via DV2 may be disposed in the upper bezel region 310, or the second lapping via DV2 may be disposed in a boundary region between the display region 100 and the upper bezel region 310.

In an exemplary implementation mode, a first connection line 70 is connected with a second connection line 80 through a first lapping via DV1 after the first connection line 70 passes through the display region 100 and extends to the upper bezel region 310, and the second connection line 80 is connected with a data signal line 60 through a second lapping via DV2 after the second connection line 80 extends from the upper bezel region 310 to the display region 100.

Figure 9:
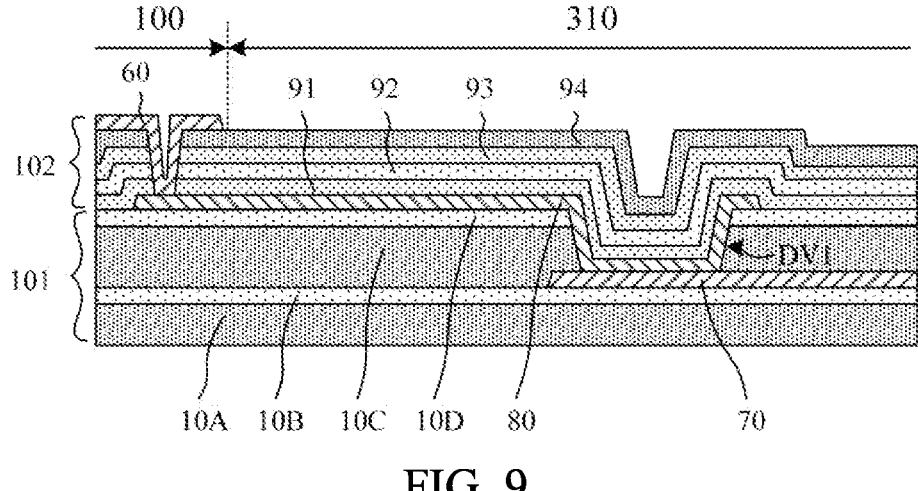
FIG. 9 is a schematic diagram of a sectional structure of a data connection line according to an exemplary embodiment of the present disclosure.

FIG. 9 is a schematic diagram of a sectional structure of a data connection line according to an exemplary embodiment of the present disclosure, and is a cross-sectional view taken along a B-B direction in FIG. 8. As shown in FIG. 9, on a plane perpendicular to the display substrate, the display substrate may at least include a drive circuit layer 102 disposed on the base substrate 101. In an exemplary implementation mode, the base substrate 101 may at least include a first flexible layer 10A, a second flexible layer 10C, and a base substrate conductive layer disposed between the first flexible layer 10A and the second flexible layer 10C, and the base substrate conductive layer may at least include a first connection line 70. The drive circuit layer 102 may at least include a data signal line 60 and a second connection line 80, the data signal line 60 is connected with the second connection line 80 through a second lapping via DV2, and the second connection line 80 is connected with the first connection line 70 through a first lapping via DV1.

In an exemplary implementation mode, the drive circuit layer 102 may at least include a shielding conductive layer, a first insulation layer 91, a semiconductor layer, a second insulation layer 92, a first conductive layer, a third insulation layer 93, a second conductive layer, a fourth insulation layer 94, and a third conductive layer that are sequentially disposed on the base substrate 101. The shielding conductive layer may at least include a second connection line 80, the semiconductor layer may at least include active layers of a plurality of transistors of a pixel drive circuit, the first conductive layer may at least include gate electrodes of the plurality of transistors and a first electrode plate of a storage capacitor, the second conductive layer may at least include a second electrode plate of the storage capacitor, and the third conductive layer may at least include a data signal line 60.

In an exemplary implementation mode, the base substrate 101 may further include a first barrier layer 10B and a second barrier layer 10D, the first barrier layer 10B is disposed between the first flexible layer 10A and the base substrate conductive layer, and the second barrier layer 10D is disposed on a side of the second flexible layer 10C away from the first flexible layer 10A.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in present disclosure. A "thin film" refers to a layer of thin film made of a material on a base substrate using a process such as deposition and coating. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B being disposed in a same layer" mentioned in the present disclosure means that A and B are formed simultaneously through a same patterning process, and a "thickness" of a film layer is a dimension of the film layer in a direction perpendicular to a display substrate. In an exemplary implementation mode of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or a boundary of the orthographic projection of A is overlapped with a boundary of the orthographic projection of B.

In an exemplary implementation mode, taking the region B in FIG. 6a and FIG. 6b as an example, the preparation process of the display substrate according to an exemplary embodiment may include following operations.

Figure 10:
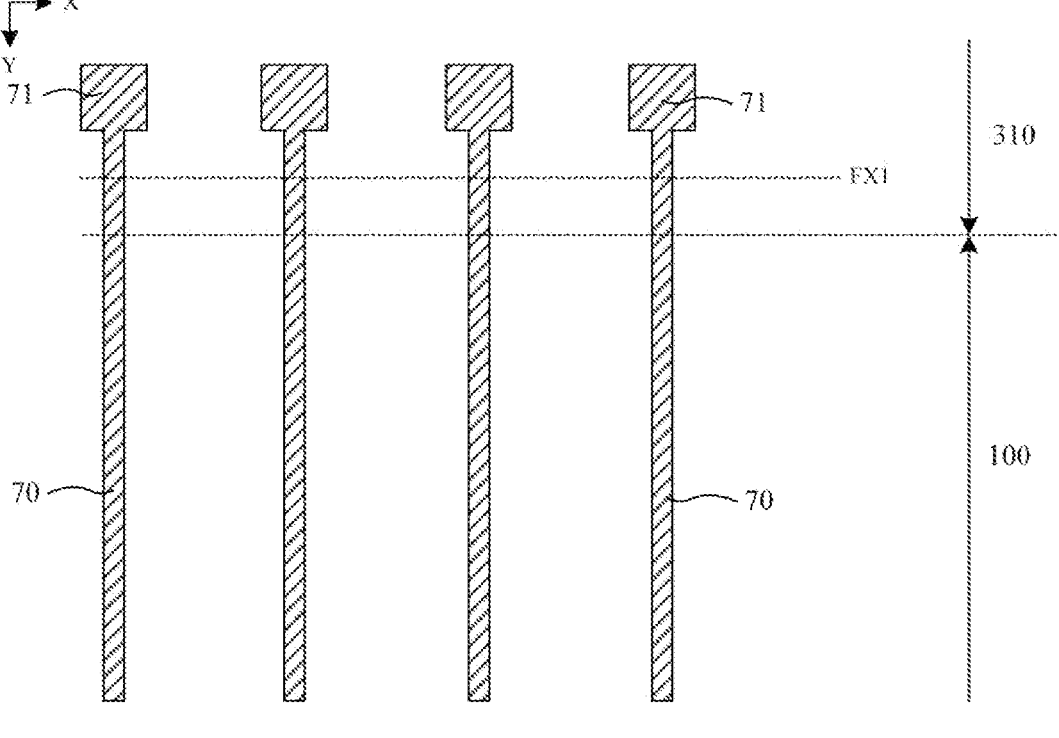
FIG. 10 is a schematic diagram of a display substrate after a base substrate is formed according to the present disclosure.

(11) A base substrate is prepared. In an exemplary implementation mode, preparing a base substrate may include: a layer of a first flexible material is coated on a glass carrier plate at first, after curing into a film, a first flexible layer 10A is formed. Then a first barrier thin film and a base substrate conductive thin film are sequentially deposited on the first flexible layer 10A, and the base substrate conductive thin film is patterned through a patterning process to form a first barrier layer 10B covering the first flexible layer 10A and a pattern of a base substrate conductive layer disposed on the first barrier layer 10B. A layer of a second flexible material is then coated and cured into a film to form a second flexible layer 10C covering the pattern of the base substrate conductive layer. Then a second barrier thin film is deposited to form a second barrier layer 10D covering the second flexible layer 10C, as shown in FIG. 10. In an exemplary implementation mode, the base substrate conductive layer may be referred to as a 0-th source-drain metal (SD0) layer.

In an exemplary implementation mode, the pattern of the base substrate conductive layer may at least include a plurality of first connection lines 70 disposed in a display region 100 and an upper bezel region 310.

In an exemplary implementation mode, a shape of a first connection line 70 may be a line shape of which a main body portion extends along a second direction Y, a first end of the first connection line 70 is connected with a leading-out line in a bonding region, and a second end of the first connection line 70 extends across the display region 100 to the upper bezel region 310.

In an exemplary implementation mode, an end of the first connection line 70 away from the display region 100 (the second end of the first connection line 70) is provided with a first connection block 71, a shape of the first connection block 71 may be a rectangle. The first connection block 71 and the first connection line 70 may be connected with each other to form an integral structure, and the first connection block 71 is configured to be connected with a second connection line formed subsequently through a first lapping via.

In an exemplary implementation mode, the first connection block 71 may be disposed on a side of a first encapsulation line FX1 away from the display region.

In the exemplary implementation mode, the plurality of first connection lines 70 may be disposed at intervals along a first direction X, and positions where the plurality of first connection lines 70 are disposed may be set according to uniformity of traces, which is not limited in the present disclosure.

In an exemplary implementation mode, materials of the first flexible layer and the second flexible layer may include, but are not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. Materials of the first barrier layer and the second barrier layer may include, but are not limited to, any one or more of Silicon Oxide (SiOx), Silicon Nitride (SiNx), and Silicon Oxynitride (SiON), and may be a single layer, a multi-layer, or a composite layer for improving water-oxygen resistance of the base substrate. The base substrate conductive layer may be made of a metal material, such as any one or more of Argentum (Ag), Copper (Cu), Aluminum (Al), and Molybdenum (Mo), or an alloy material of the aforementioned metals. For example, the base substrate conductive layer may be made of metal molybdenum.

In an exemplary implementation mode, a Titanium/Aluminum/Titanium (Ti/Al/Ti) composite structure may be adopted for the base substrate conductive layer, which is beneficial to reducing a resistance of a first connection line. Although a length of the first connection line is increased by extending the first connection line to the upper bezel region, the resistance of the first connection line may be effectively reduced through a structural design such as multi-film layer and multi-parallel connection.

In the display substrate according to the exemplary embodiment of the present disclosure, by disposing the base substrate conductive layer between double flexible layers of the base substrate, and the base substrate conductive layer includes a first connection line for achieving a fan-out function in the display region and the upper bezel region, which is beneficial to reducing a trace density of the bonding region.

Figure 11:
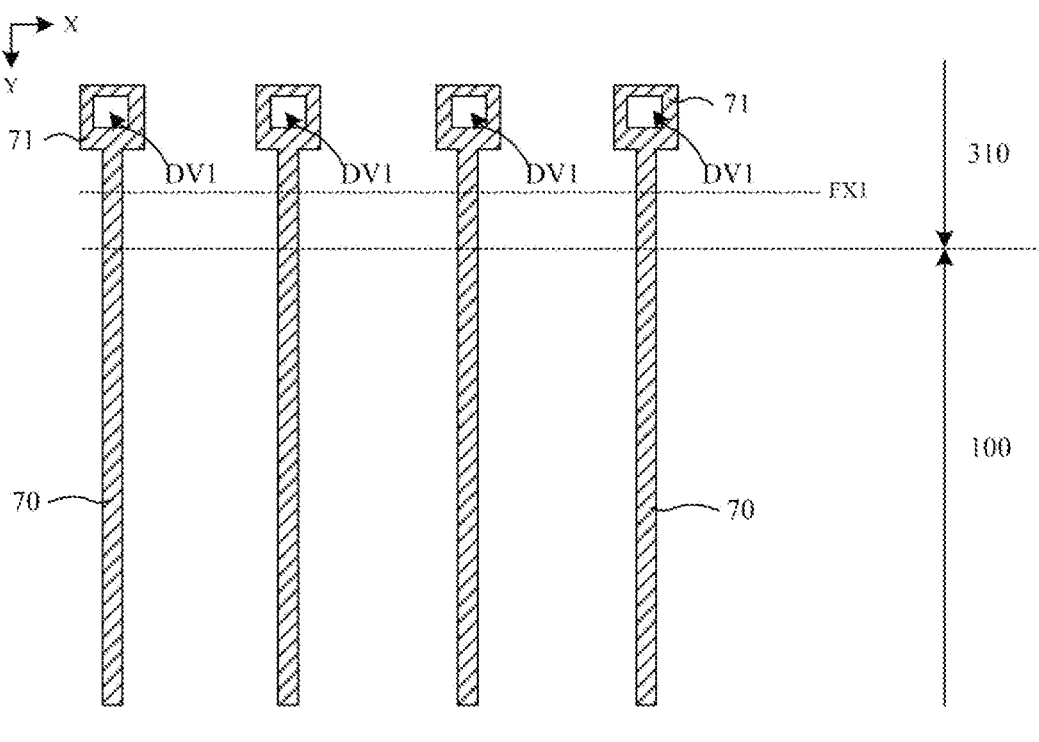
FIG. 11 is a schematic diagram of a display substrate after a first lapping via is formed according to the present disclosure.

(12) A pattern of a first lapping via is formed. In an exemplary implementation mode, forming a pattern of a first lapping via may include: the second barrier layer and the second flexible layer are patterned through a patterning process to form a plurality of first lapping vias DV1, as shown in FIG. 11.

In an exemplary implementation mode, the plurality of first lapping vias DV1 may be disposed on a side of the first encapsulation line FX1 away from the display region 100, that is, the first lapping vias DV1 may be disposed in the non-encapsulation region within the upper bezel region 310.

In an exemplary implementation mode, an orthographic projection of a first lapping via DV1 on the base substrate may be within a range of an orthographic projection of the first connection block 71 on the base substrate, the second barrier layer and the second flexible layer within the first lapping via DV1 are removed to expose a surface of the first connection block 71, the first lapping via DV1 is configured such that a second connection line formed subsequently is connected with the first connection block 71 through the via.

In an exemplary implementation mode, a shape of the first lapping via DV1 may include any one or more of following: a triangle, a rectangle, a pentagon, a hexagon, a circle, an ellipse.

Figure 12:
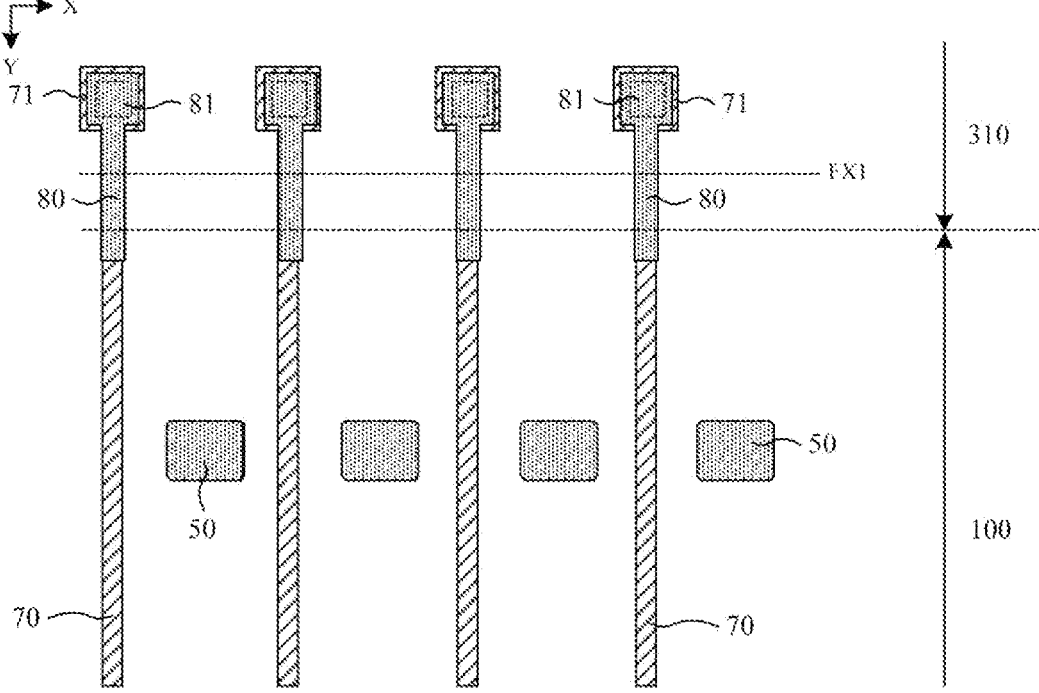
FIG. 12 is a schematic diagram of a display substrate after a shielding conductive layer is formed according to the present disclosure.

(13) A pattern of a shielding conductive layer is formed. In an exemplary implementation mode, forming a pattern of a shielding conductive layer may include: a shielding thin film is deposited on the base substrate, and the shielding thin film is patterned through a patterning process to form a pattern of a Shielding conductive Layer (SHL) on the second barrier layer, as shown in FIG. 12.

In an exemplary implementation mode, the pattern of the shielding conductive layer may at least include a shielding electrode 50 disposed in the display region 100 and second connection lines 80 disposed in the display region 100 and the upper bezel region 310.

In an exemplary implementation mode, a shape of the shielding electrode 50 may be a rectangular shape and may be disposed in each circuit unit of the display region 100, and the shielding electrode 50 is configured to shield at least one transistor of the pixel drive circuit to reduce an influence of light on electrical characteristics of the transistor. In addition, the shielding electrode 50 may further be configured to suppress accumulation of electrons generated by collision ionization within a channel, weaken accumulation of Joule heat in the channel, and the like.

In an exemplary implementation mode, a shape of the second connection line 80 may be a line shape of which a main body portion extends along the second direction Y. An end of the second connection line 80 away from the display region 100 (a first end of the second connection line 80) is provided with a second connection block 81, a shape of the second connection block 81 may be a rectangular shape, and the second connection block 81 is connected with the first connection block 71 through the first lapping via DV1. A second end of the second connection line 80 extends to the display region 100 and a second end of the second connection line 80 is configured to be connected with a data signal line formed subsequently.

Figure 13:
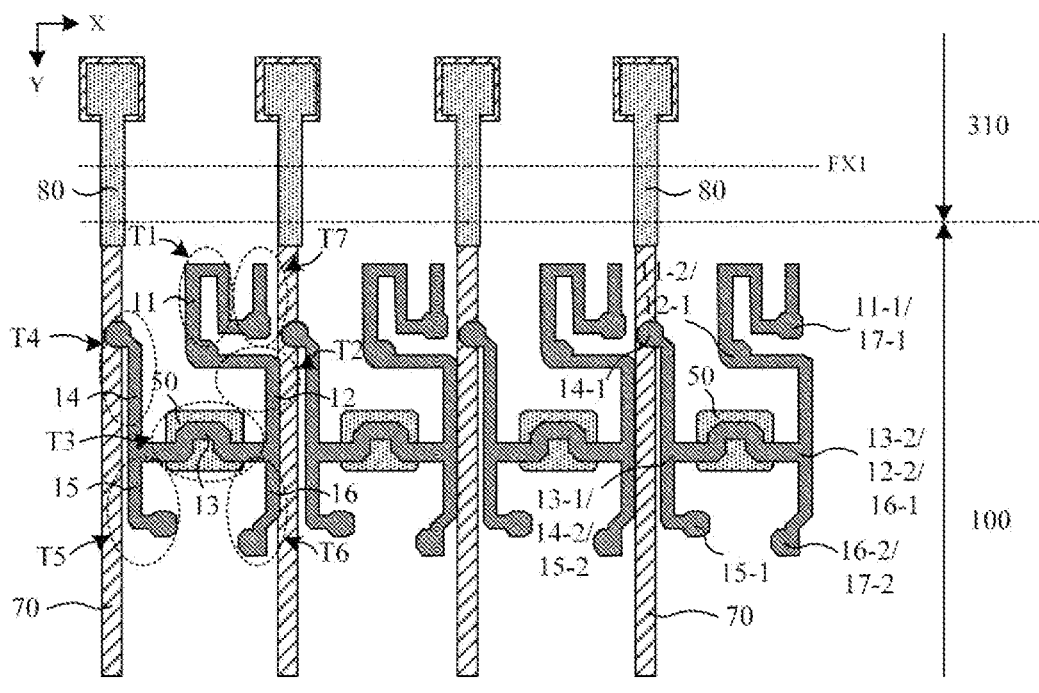
FIG. 13 is a schematic diagram of a display substrate after a semiconductor layer is formed according to the present disclosure.

(14) A pattern of a semiconductor layer is formed. In an exemplary implementation mode, forming a pattern of a semiconductor layer may include: depositing sequentially a first insulation thin film and a semiconductor thin film on the base substrate, and patterning the semiconductor thin film through a patterning process to form a first insulation layer covering the shielding conductive layer and a pattern of a semiconductor layer disposed on the first insulation layer, as shown in FIG. 13.

In an exemplary implementation mode, the pattern of the semiconductor layer of each circuit unit in the display region may at least include a first active layer 11 of a first transistor T1 to a seventh active layer 17 of a seventh transistor T7, and the first active layer 11 to the seventh active layer 17 are of an integral structure connected with each other. In the second direction Y, a sixth active layer 16 in a circuit unit of a present unit column and a seventh active layer 17 in a circuit unit of a next unit column are connected with each other.

In an exemplary implementation mode, in the first direction X, a second active layer 12 and a sixth active layer 16 may be located on a same side of a third active layer 13 in a present circuit unit, a fourth active layer 14 and a fifth active layer 15 may be located on a same side of the third active layer 13 in the present circuit unit, and the second active layer 12 and the fourth active layer 14 may be located on different sides of the third active layer 13 of the present circuit unit. In the second direction Y, a first active layer 11, the second active layer 12, the fourth active layer 14, and a seventh active layer 17 may be located on a side of the third active layer 13 in the present circuit unit in a direction opposite to the second direction Y, and the fifth active layer 15 and the sixth active layer 16 may be located on a side of the third active layer 13 of the present circuit unit in the second direction Y.

In an exemplary implementation mode, an orthographic projection of the third active layer 13 on the base substrate may be within a range of an orthographic projection of the shielding electrode 50 on the base substrate, and the shielding electrode 50 may shield the third active layer 13 to reduce an influence of light on electrical characteristics of a drive transistor.

In an exemplary implementation mode, the first active layer 11 may be in an "n" shape, the second active layer 12 and the fifth active layer 15 may be in an "L" shape, the third active layer 13 may be in an "Ω" shape, the fourth active layer 14, the sixth active layer 16, and the seventh active layer 17 may be in an "I" shape.

In an exemplary implementation mode, an active layer of each transistor may include a first region, a second region, and a channel region located between the first region and the second region. In an exemplary implementation mode, a first region 11-1 of the first active layer 11 may serve as a first region 17-1 of the seventh active layer 17; a second region 11-2 of the first active layer 11 may serve as a first region 12-1 of the second active layer 12; a first region 13-1 of the third active layer 13 may serve as a second region 14-2 of the fourth active layer 14 and a second region 15-2 of the fifth active layer 15 simultaneously; a second region 13-2 of the third active layer 13 may serve as a second region 12-2 of the second active layer 12 and a first region 16-1 of the sixth active layer 16 simultaneously; a second region 16-2 of the sixth active layer 16 may serve as a second region 17-2 of the seventh active layer 17; a first region 14-1 of the fourth active layer 14 and a first region 15-1 of the fifth active layer 15 may be separately disposed.

In an exemplary implementation mode, an orthographic projection of the semiconductor layer on the base substrate is not overlapped with an orthographic projection of the second connection line 80 on the base substrate.

Figure 14:
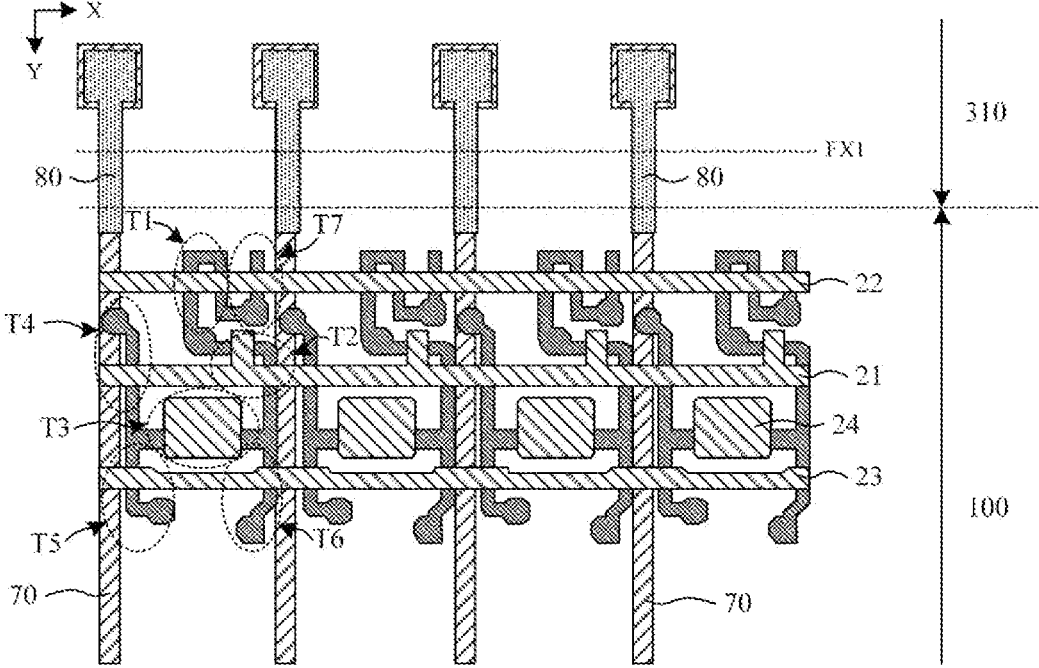
FIG. 14 is a schematic diagram of a display substrate after a first conductive layer is formed according to the present disclosure.

(15) A pattern of a first conductive layer is formed. In an exemplary implementation mode, forming a pattern of a first conductive layer may include: sequentially depositing a second insulation thin film and a first conductive thin film on the base substrate on which the above-mentioned patterns are formed, and patterning the first conductive thin film through a patterning process to form a second insulation layer that covers the pattern of the semiconductor layer and a pattern of a first conductive layer disposed on the second insulation layer, as shown in FIG. 14. In an exemplary implementation mode, the first conductive layer may be referred to as a first gate metal (GATE1) layer.

In an exemplary implementation mode, the pattern of the first conductive layer of each circuit unit in the display region may at least include a first scan signal line 21, a second scan signal line 22, a light emitting control line 23, and a first electrode plate 24 of a storage capacitor.

In an exemplary implementation mode, the first electrode plate 24 may be in a shape of a rectangle, and corners of the rectangle may be provided with chamfers. An orthographic projection of the first electrode plate 24 on the base substrate is at least partially overlapped with an orthographic projection of the third active layer of the third transistor T3 on the base substrate. In an exemplary implementation mode, the first electrode plate 24 may serve as an electrode plate of the storage capacitor and a gate electrode of the third transistor T3 simultaneously.

In an exemplary implementation mode, the first scan signal line 21 may be in a line shape of which a main body portion extends along the first direction X, and the first scan signal line 21 may be located on a side of the first electrode plate 24 of the present circuit unit in the direction opposite to the second direction Y. The first scan signal line 21 of each circuit unit is provided with a gate block, a first end of the gate block is connected with the first scan signal line 21, and a second end of the gate block extends towards a direction away from the first electrode plate 24. A region where the first scan signal line 21 and the gate block are overlapped with the second active layer of the present circuit unit serves as a gate electrode of the second transistor T2 with a double-gate structure, and a region where the first scan signal line 21 is overlapped with the fourth active layer of the present circuit unit serves as a gate electrode of the fourth transistor T4.

In an exemplary implementation mode, the second scan signal line 22 may be in a line shape of which a main body portion extends along the first direction X, the second scan signal line 22 may be located on a side of the first scan signal line 21 of the present circuit unit away from the first electrode plate 24, a region where the second scan signal line 22 is overlapped with the first active layer of the present circuit unit serves as a gate electrode of the first transistor T1 with a double-gate structure, and a region where the second scan signal line 22 is overlapped with the seventh active layer of the present circuit unit serves as a gate electrode of the seventh transistor T7.

In an exemplary implementation mode, the light emitting control line 23 may be in a line shape of which a main body portion extends along the first direction X, the light emitting control line 23 may be located on a side of the first electrode plate 24 of the present circuit unit in the second direction Y, a region where the light emitting control line 23 is over-lapped with the fifth active layer of the present circuit unit serves as a gate electrode of the fifth transistor T5, and a region where the light emitting control line 23 is overlapped with the sixth active layer of the present circuit unit serves as a gate electrode of the sixth transistor T6.

In an exemplary implementation mode, the first scan signal line 21, the second scan signal line 22, and the light emitting control line 23 may be designed with an equal width or may be designed with non-equal widths, may be straight lines or may be polygonal lines, which may not only facilitate a layout of a pixel structure, but also reduce a parasitic capacitance between signal lines, which is not limited in the present disclosure.

In an exemplary implementation mode, after the pattern of the first conductive layer is formed, the semiconductor layer may be subjected to a conductive treatment by using the first conductive layer as a shield. The semiconductor layer in a region which is shielded by the first conductive layer, forms a channel region of the first transistor T1 to the seventh transistor T7, and the semiconductor layer in a region which is not shielded by the first conductive layer, is made to be conductive, that is, first regions and second regions of the first transistor T1 to the seventh active layer are all made to be conductive.

Figure 15:
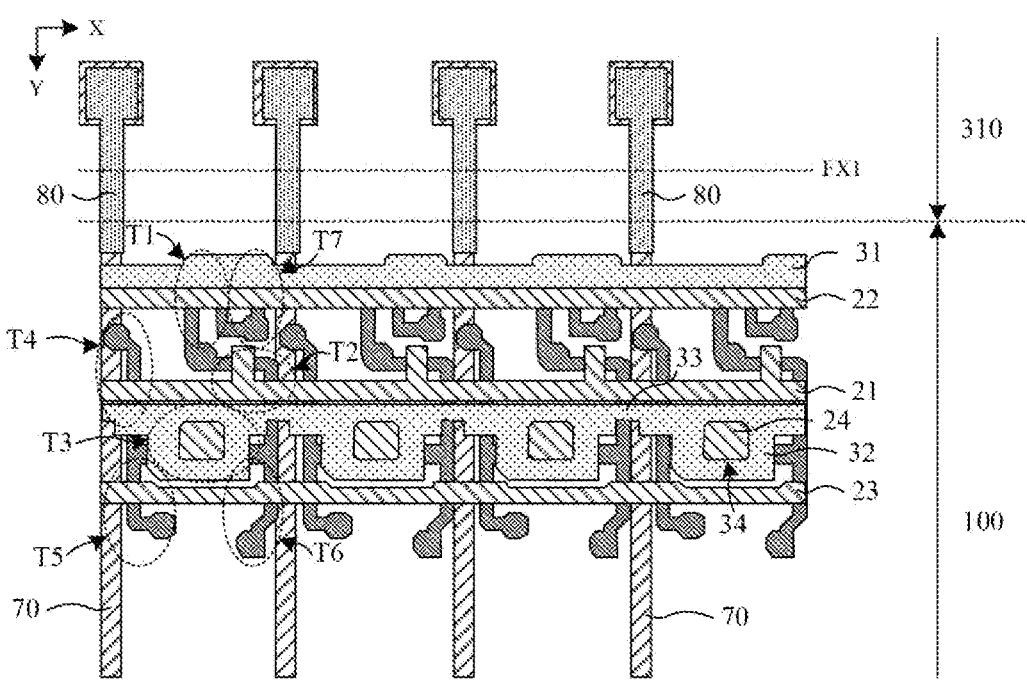
FIG. 15 is a schematic diagram of a display substrate after a second conductive layer is formed according to the present disclosure.

(16) A pattern of a second conductive layer is formed. In an exemplary implementation mode, forming a pattern of a second conductive layer may include: a third insulation thin film and a second conductive thin film are deposited sequentially on the base substrate on which the afore-mentioned patterns are formed, and the second conductive thin film is patterned through a patterning process to form a third insulation layer covering the first conductive layer and a pattern of a second conductive layer disposed on the third insulation layer, as shown in FIG. 15. In an exemplary implementation mode, the second conductive layer may be referred to as a second gate metal (GATE2) layer.

In an exemplary implementation mode, the pattern of the second conductive layer of each circuit unit in the display region at least includes an initial signal line 31, a second electrode plate 32 of the storage capacitor and an electrode plate connection line 33.

In an exemplary implementation mode, a profile of second electrode plate 32 may be in a shape of a rectangle, corners of the rectangle may be provided with chamfers. An orthographic projection of the second electrode plate 32 on the base substrate is at least partially overlapped with an orthographic projection of the first electrode plate 24 on the base substrate. The second electrode plate may serve as another electrode plate of the storage capacitor, the first electrode plate 24 and the second electrode plate 32 form the storage capacitor of the pixel drive circuit.

In an exemplary implementation mode, the second electrode plate 32 is provided with an opening 34 which may have a rectangular shape and may be located in a middle part of the second electrode plate 32, so that the second electrode plate 32 forms an annular structure. The opening 34 exposes the third insulation layer covering the first electrode plate 24, and the orthographic projection of the first electrode plate 24 on the base substrate contains an orthographic projection of the opening 34 on the base substrate. In an exemplary implementation mode, the opening 34 is configured to accommodate a first via formed subsequently, and the first via is located in the opening 34 and exposes the first electrode plate 24, so that a second electrode of the first transistor T1 formed subsequently is connected with the first electrode plate 24.

In an exemplary implementation mode, second electrode plates 32 in two adjacent sub-pixels in one unit row are connected with each other through an electrode plate connection line 33. For example, a second electrode plate 32 of an (N−1)-th column and a second electrode plate 32 of an N-th column may be connected with each other through an electrode plate connection line 33. For another example, the second electrode plate 32 of the N-th column and a second electrode plate 32 of an (N+1)-th column are connected with each other through an electrode plate connection line 33. In an exemplary implementation mode, since a second electrode plate 32 in each circuit unit is connected with a first power supply line formed subsequently, second electrode plates 32 of adjacent circuit units form an integral structure connected with each other, the second electrode plates in the integral structure may be multiplexed as power supply signal lines, which may ensure that a plurality of second electrode plates in one unit row have a same potential, it is beneficial to improving uniformity of a panel and avoiding poor display of the display substrate, thereby ensuring a display effect of the display substrate.

In an exemplary implementation mode, the initial signal line 31 may be in a line shape of which a main body portion extends along the first direction X. The initial signal line 31 may be located on a side of the second scan signal line 22 of the present circuit unit away from the first scan signal line, and the initial signal line 31 is configured to be connected with a first electrode of the first transistor T1 (which is also a first electrode of the seventh transistor T7) which is formed subsequently.

Figure 16:
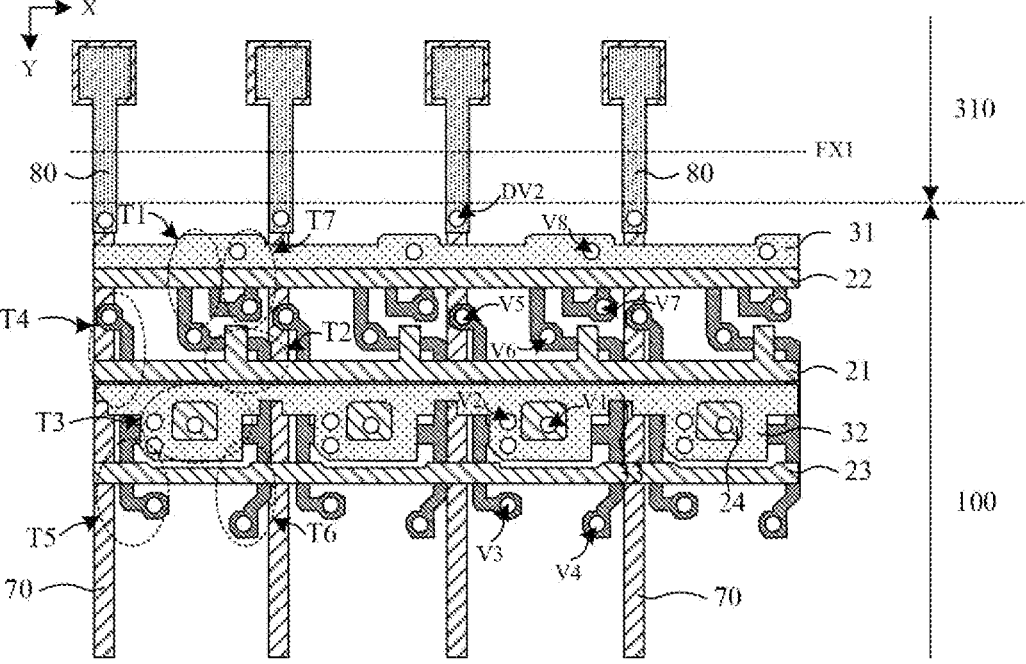
FIG. 16 is a schematic diagram of a display substrate after a fourth insulation layer is formed according to the present disclosure.

(17) A pattern of a fourth insulation layer is formed. In an exemplary implementation mode, forming a pattern of a fourth insulation layer may include: depositing a fourth insulation thin film on the base substrate on which the aforementioned patterns are formed, and patterning the fourth insulation thin film through a patterning process, to form a fourth insulation layer covering the second conductive layer, wherein a plurality of vias are disposed on the fourth insulation layer, as shown in FIG. 16.

In an exemplary implementation mode, the plurality of vias of each circuit unit in the display region at least include: a first via V1, a second via V2, a third via V3, a fourth via V4, a fifth via V5, a sixth via V6, a seventh via V7, and an eighth via V8.

In an exemplary implementation mode, an orthographic projection of the first via V1 on the base substrate is within a range of an orthographic projection of the opening 34 on the base substrate, the fourth insulation layer and the third insulation layer within the first via V1 are etched away to expose a surface of the first electrode plate 24, and the first via V1 is configured such that a second electrode of the first transistor T1 formed subsequently (which is also a first electrode of the second transistor T2) is connected with the first electrode plate 24 through the via.

In an exemplary implementation mode, an orthographic projection of the second via V2 on the base substrate is within a range of an orthographic projection of the second electrode plate 32 on the base substrate, the fourth insulation layer within the second via V2 is etched away to expose a surface of the second electrode plate 32, and the second via V2 is configured such that a first power supply line formed subsequently is connected with the second electrode plate 32 through the via. In an exemplary implementation mode, there may be a plurality of second vias V2, and the plurality of second vias V2 may be disposed in sequence along the second direction Y to improve connection reliability.

In an exemplary implementation mode, an orthographic projection of the third via V3 on the base substrate is within a range of an orthographic projection of a first region of the fifth active layer on the base substrate. The fourth insulation layer, the third insulation layer, and the second insulation layer within the third via V3 are etched away to expose a surface of the first region of the fifth active layer, and the third via V3 is configured such that the first power supply line formed subsequently is connected with the first region of the fifth active layer through the via.

In an exemplary implementation mode, an orthographic projection of the fourth via V4 on the base substrate is within a range of an orthographic projection of a second region of the sixth active layer (which is also a second region of the seventh active layer) on the base substrate. The fourth insulation layer, the third insulation layer, and the second insulation layer within the fourth via V4 are etched away to expose a surface of the second region of the sixth active layer, the fourth via V4 is configured such that a second electrode of the sixth transistor T6 (which is also a second electrode of the seventh transistor T7) formed subsequently is connected with the second region of the sixth active layer through the via.

In an exemplary implementation mode, an orthographic projection of the fifth via V5 on the base substrate is within a range of an orthographic projection of a first region of the fourth active layer on the base substrate. The fourth insulation layer, the third insulation layer, and the second insulation layer within the fifth via V5 are etched away to expose a surface of the first region of the fourth active layer, and the fifth via V5 is configured such that a data signal line formed subsequently is connected with the first region of the fourth active layer through the via.

In an exemplary implementation mode, an orthographic projection of the sixth via V6 on the base substrate is within a range of an orthographic projection of a second region of the first active layer (which is also a first region of the second active layer) on the base substrate. The fourth insulation layer, the third insulation layer, and the second insulation layer within the sixth via V6 are etched away to expose a surface of the second region of the first active layer, the sixth via V6 is configured such that a second electrode of the first transistor T1 (which is also a first electrode of the second transistor T2) formed subsequently is connected with the second region of the first active layer (which is also the first region of the second active layer) through the via.

In an exemplary implementation mode, an orthographic projection of the seventh via V7 on the base substrate is within a range of an orthographic projection of a first region of the first active layer (which is also a first region of the seventh active layer) on the base substrate. The fourth insulation layer, the third insulation layer, and the second insulation layer within the seventh via V7 are etched away to expose a surface of the first region of the first active layer, the seventh via V7 is configured such that a first electrode of the first transistor T1 (which is also a first electrode of the seventh transistor T7) formed subsequently is connected with the first region of the first active layer (which is also the first region of the seventh active layer) through the via.

In an exemplary implementation mode, an orthographic projection of the eighth via V8 on the base substrate is within a range of an orthographic projection of the initial signal line 31 on the base substrate, the fourth insulation layer within the eighth via V8 is etched away to expose a surface of the initial signal line 31, and the eighth via V8 is configured such that a first electrode of the first transistor T1 (which is also a first electrode of the seventh transistor T7) formed subsequently is connected with the initial signal line 31 through the via.

In an exemplary implementation mode, the plurality of vias further include a second lapping via DV2 which may be disposed in some circuit units. An orthographic projection of the second lapping via DV2 on the base substrate is within a range of an orthographic projection of the second end of the second connection line 80 on the base substrate. The fourth insulation layer, the third insulation layer, the second insulation layer, and the first insulation layer within the second lapping via DV2 are etched away to expose a surface of the second end of the second connection line 80, and the second lapping via DV2 is configured such that a data signal line formed subsequently is connected with the second connection line 80 through the via.

In an exemplary implementation mode, the orthographic projection of the second lapping via DV2 on the base substrate is not overlapped with an orthographic projection of the first lapping via DV1 on the base substrate.

Figure 17:
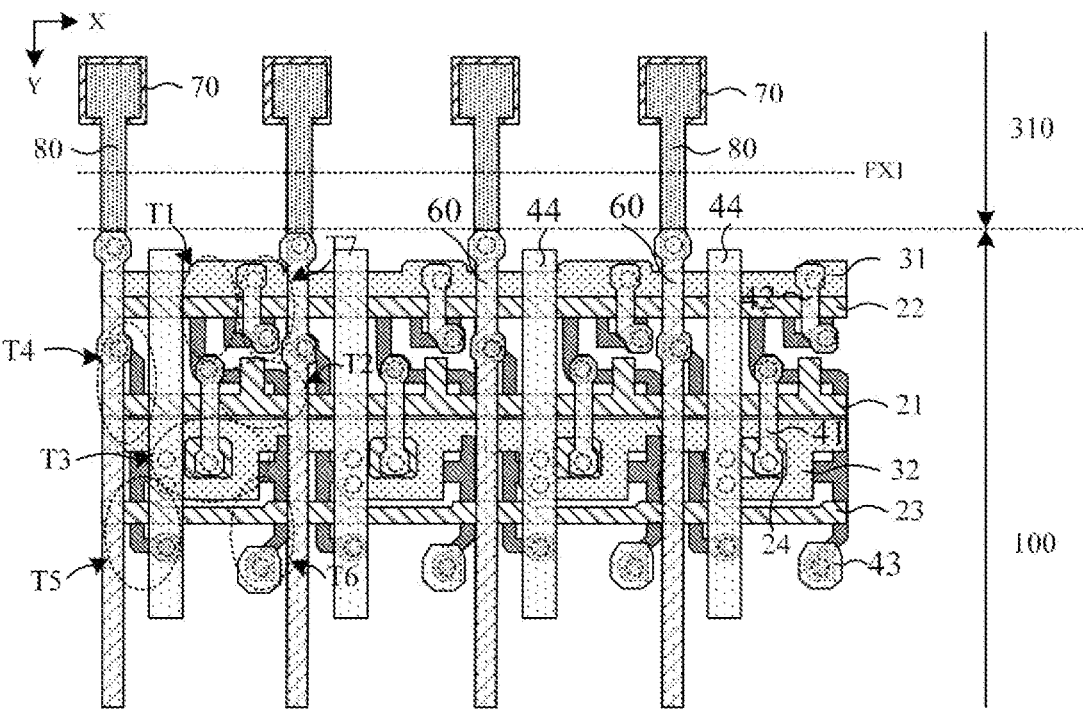
FIG. 17 is a schematic diagram of a display substrate after a third conductive layer is formed according to the present disclosure.

(18) A pattern of a third conductive layer is formed. In an exemplary implementation mode, forming the third conductive layer may include: a third conductive thin film is deposited on the base substrate on which the aforementioned patterns are formed, the third conductive thin film is patterned through a patterning process to form the third conductive layer disposed on the fourth insulation layer, as shown in FIG. 17. In an exemplary implementation mode, the third conductive layer may be referred to as a first source-drain metal (SD1) layer.

In an exemplary implementation mode, the third conductive layer of each circuit unit in the display region at least includes a first connection electrode 41, a second connection electrode 42, a third connection electrode 43, a first power supply line 44, and a data signal line 60.

In an exemplary implementation mode, the first connection electrode 41 may be in a straight line shape of which a main body portion extends along the second direction Y. A first end of the first connection electrode 41 is connected with the first electrode plate 24 through the first via V1, and a second end of the first connection electrode 41 is connected with a second region of the first active layer (which is also a first region of the second active layer) through the sixth via V6, so that the first electrode plate 24, the second region of the first active laye, and the first region of the second active layer have a same potential. In an exemplary implementation mode, the first connection electrode 41 may serve as a second electrode of the first transistor T1 and a first electrode of the second transistor T2 simultaneously.

In an exemplary implementation mode, the second connection electrode 42 may be in a polygonal line shape of which a main body portion extends along the second direction Y. A first end of the second connection electrode 42 is connected with the initial signal line 31 through the eighth via V8, and a second end of the second connection electrode 42 is connected with a first region of the first active layer (which is also a first region of the seventh active layer) through the seventh via V7. In an exemplary implementation mode, the second connection electrode 42 may serve as a first electrode of the first transistor T1 and a first electrode of the seventh transistor T7 simultaneously.

In an exemplary implementation mode, a shape of the third connection electrode 43 may be a block shape, and the third connection electrode 43 is connected with a second region of the sixth active layer (which is also a second region of the seventh active layer) through the fourth via V4. In an exemplary implementation mode, the third connection electrode 43 may serve as a second electrode of the sixth transistor T6 and a second electrode of the seventh transistor T7 simultaneously, and the third connection electrode 43 is configured to be connected with an anode connection electrode formed subsequently.

In an exemplary implementation mode, the first power supply line 44 may be in a straight line shape of which a main body portion extends along the second direction Y. On one hand, the first power supply line 44 is connected with the second electrode plate 32 through the second via V2, on the other hand, the first power supply line 44 is connected with a first region of the fifth active layer through the third via V3, it is achieved that a power supply signal is written into a first electrode of the fifth transistor T5, and the second electrode plate 32 and the first electrode of the fifth transistor T5 have a same potential.

In an exemplary implementation mode, the data signal line 60 may be in a straight line shape of which a main body portion extends along the second direction Y. The data signal line 60 is connected with a first region of the fourth active layer through the fifth via V5, it is achieved that a data signal is written into a first electrode of the fourth transistor T4.

In an exemplary implementation mode, the data signal line 60 is also connected with the second connection line 80 through the second lapping via DV2. Since the second connection line 80 is connected with the first connection line 70 through the first lapping via, thus it is achieved that the data signal line 60 of the display region 100 is connected with a leading-out line of the bonding region through the first connection line 70 and the second connection line 80.

A subsequent preparation process may include forming a first planarization layer, forming a fourth conductive layer, forming a second planarization layer, and the like, and a drive circuit layer is prepared on the glass carrier plate.

In an exemplary implementation mode, on a plane parallel to the display substrate, the drive circuit layer of the display region may include a plurality of circuit units, each of the circuit units may include a pixel drive circuit, the pixel drive circuit is connected with a first scan signal line 21, a second scan signal line 22, a light emitting control line 23, an initial signal line 31, a first power supply line 44, and a data signal line 60, respectively. The drive circuit layer of the display region and the upper bezel region may include a plurality of first connection lines 70 and a plurality of second connection lines 80. A second connection line is connected with a first connection line 70 through the first lapping via DV1, and the data signal line 60 is connected with the second connection line 80 through the second lapping via DV2.

In an exemplary implementation mode, on a plane perpendicular to the display substrate, the drive circuit layer may be disposed on the base substrate. The base substrate may include a first flexible layer 10A, a first barrier layer 10B, a base substrate conductive layer, a second flexible layer 10C, and a second barrier layer 10D that are stacked, and the base substrate conductive layer may at least include first connection lines 70 located in the display region and the upper bezel region. The drive circuit layer may at least include a shielding conductive layer, a first insulation layer, a semiconductor layer, a second insulation layer, a first conductive layer, a third insulation layer, a second conductive layer, a fourth insulation layer, and a third conductive layer that are sequentially disposed on the base substrate. The shielding conductive layer may at least include second connection lines 80 located in the display region and the upper bezel region, and a second connection line 80 is connected with a first connection line 70 through the first lapping via DV1. The semiconductor layer may at least include active layers of a first transistor to a seventh transistor. The first conductive layer may at least include a first scan signal line 21, a second scan signal line 22, a light emitting control line 23, and a first electrode plate 24 of a storage capacitor. The second conductive layer may at least include an initial signal line 31, a second electrode plate 32 of the storage capacitor, and an electrode plate connection line 33. The third conductive layer may at least include a first connection electrode 41, a second connection electrode 42, a third connection electrode 43, a first power supply line 44, and a data signal line 60, and the data signal line 60 is connected with the second connection line 80 through the second lapping via DV2.

In an exemplary implementation mode, the shielding conductive layer, the first conductive layer, the second conductive layer, and the third conductive layer may be made of a metal material, such as any one or more of Argentum (Ag), Copper (Cu), Aluminum (Al), and Molybdenum (Mo), or an alloy material of the above metals, such as an Aluminum-Neodymium alloy (AlNd) or a Molybdenum-Niobium alloy (MoNb), and may be of a single-layer structure, or a multi-layer composite structure such as Mo/Cu/Mo. The first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first insulation layer may be referred to as a Buffer layer, the second insulation layer and the third insulation layer may be referred to as Gate Insulation (GI) layers, and the fourth insulation layer may be referred to as an Interlayer Dielectric (ILD) layer. The semiconductor layer may be made of a material such as amorphous Indium Gallium Zinc Oxide (a-IGZO), Zinc Oxynitride (ZnON), Indium Zinc Tin Oxide (IZTO), amorphous Silicon (a-Si), poly Silicon (p-Si), hexathiophene, or polythiophene. That is, the embodiment of the present disclosure is applicable to a thin film transistor that is manufactured based on an oxide technology, a silicon technology, or an organic matter technology.

In an exemplary implementation mode, after the drive circuit layer is prepared, a light emitting structure layer and an encapsulation structure layer may be sequentially prepared on the drive circuit layer.

In an exemplary implementation mode, preparing the light emitting structure layer may include: first forming an anode conductive layer, wherein the anode conductive layer may at least include patterns of a plurality of anodes. Then, a pixel definition layer is formed, and a pixel opening is disposed on the pixel definition layer of each circuit unit, and the pixel definition layer within the pixel opening is removed to expose an anode of the circuit unit. Then, an organic emitting layer is formed using an evaporation or inkjet printing process, and then a cathode is formed on the organic emitting layer.

In an exemplary implementation mode, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is disposed between the first encapsulation layer and the third encapsulation layer to ensure that external water and oxygen cannot enter the light emitting structure layer.

In an exemplary implementation mode, the encapsulation structure layer may be formed in the display region and the upper bezel region, and the encapsulation structure layer in the upper bezel region may be located on a side of the first encapsulation line FX1 close to the display region.

As may be seen from a structure and the preparation process of the display substrate described above, in the display substrate provided by the present disclosure, a base substrate conductive layer is disposed between double flexible layers of a base substrate, the base substrate conductive layer includes a first connection line, and the first connection line is connected with a data signal line through a second connection line, thus achieving a data trace in the display region, which may reduce a width of a lower bezel and be beneficial to achieving full-screen display.

In a display substrate in which a FIAA structure is adopted, a first lapping via for connecting a first connection line with a second connection line and a second lapping via for connecting the second connection line with a data signal line are all disposed in a display region. The researches show that, since a hole-digging film layer of the first lapping via includes a second flexible layer, a depth of the first lapping via is large and is about 5 μm to 8 μm, so that a region of the first lapping via is easy to cause encapsulation failure, and external water and oxygen will invade a light emitting structure layer through the first lapping via, which will affect reliability life of a display apparatus adversely. In the display substrate provided by the exemplary embodiment of the present disclosure, by disposing a first lapping via connecting a first connection line and a second connection line on a side of a first encapsulation line away from a display region, i.e., disposing a lapping via outside an encapsulation region, not only encapsulation failure caused by the first lapping via may be avoided and a design risk may be reduced, but also difficulties of an encapsulation process may be effectively reduced and a reliability risk of encapsulation may be reduced, thus process quality and product quality are improved to a maximum extent.

In the present disclosure, a first lapping via is disposed in an upper bezel region and is located between an isolation dam and a crack dam, and since there are few film layers in a region between the isolation dam and the crack dam, process quality of opening the first lapping via may be effectively guaranteed. Opening a relatively deep first lapping via has relatively little influence on a film layer structure of a display region, occupies small space, and has a low production cost.

In the display substrate provided by the exemplary embodiment of the present disclosure, a shielding conductive layer is connected with a base substrate conductive layer through a first lapping via, a hole-digging film layer is a second flexible layer and a second barrier layer, which effectively reduces a depth of the first lapping via, and the depth of the first lapping via may be reduced by about 1 μm, which not only reduces process difficulties, but also improves connection quality and reliability of a first connection line and a second connection line, and improves a yield of products. Since the display substrate usually includes the shielding conductive layer, for a solution in which a connection is performed by using the shielding conductive layer, not only no new film layer is added, but also a mature process is adopted, and may be well compatible with an existing preparation process, and the process is simple to achieve, easy to implement, high in a production efficiency, low in a production cost, and high in a yield.

Figure 18:
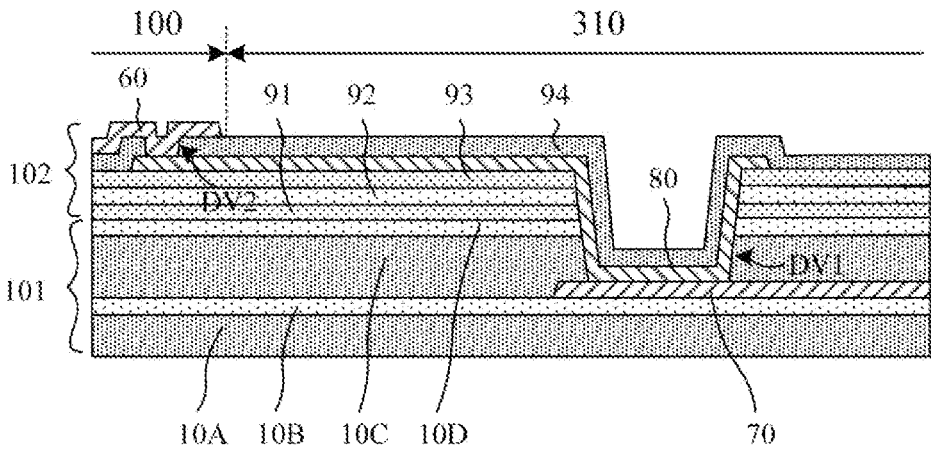
FIG. 18 is a schematic diagram of a sectional structure of another data connection line according to an exemplary embodiment of the present disclosure.

FIG. 18 is a schematic diagram of a sectional structure of another data connection line according to an exemplary embodiment of the present disclosure, and is a cross-sectional view taken along a B-B direction in FIG. 8. As shown in FIG. 18, a main body structure of a display substrate according to this exemplary embodiment is substantially similar to a main body structure shown in FIG. 9, but a difference is that in this exemplary embodiment, a first connection line 70 is disposed in a base substrate conductive layer and a second connection line 80 is disposed in a second conductive layer.

In an exemplary implementation mode, a first lapping via DV1 may be disposed in an upper bezel region 310, and the first lapping via DV1 may be disposed on a side of a first encapsulation line FX1 away from a display region 100, and a second lapping via DV2 may be disposed in the display region 100, a data signal line 60 is connected with the second connection line 80 through the second lapping via DV2, and the second connection line 80 is connected with the first connection line 70 through the first lapping via DV1.

In an exemplary implementation mode, a preparation process of the display substrate according to the exemplary embodiment may include following operations.

(21) A base substrate is prepared. In an exemplary implementation mode, a process of preparing the base substrate may be substantially the same as the act (11) of the aforementioned embodiment, the base substrate may include a first flexible layer, a first barrier layer, a base substrate conductive layer, a second flexible layer, and a second barrier layer that are stacked on a glass carrier plate, a pattern of the base substrate conductive layer may at least include a plurality of first connection lines 70 disposed in the display region 100 and the upper bezel region 310, and a first connection block 71 is disposed at an end of a first connection line 70 away from the display region 100, and the first connection block 71 may be disposed on a side of the first encapsulation line FX1 away from the display region, as shown in FIG. 10.

Figure 19:
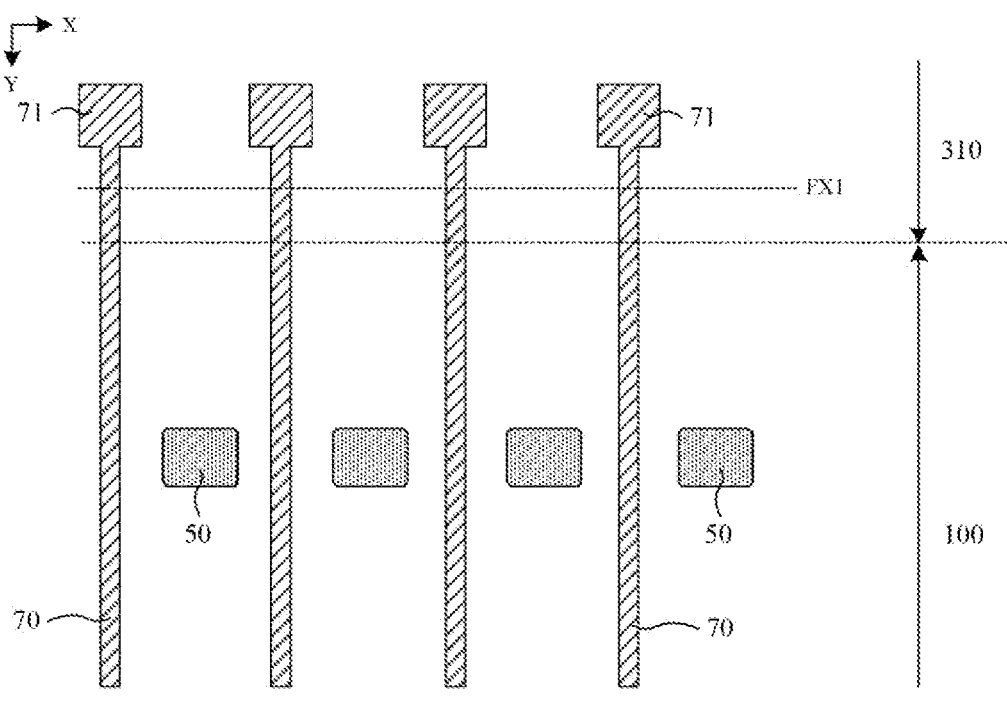
FIG. 19 is a schematic diagram of another display substrate after a shielding conductive layer is formed according to the present disclosure.

(22) A pattern of a shielding conductive layer is formed. In an exemplary implementation mode, a process of forming the pattern of the shielding conductive layer may be substantially the same as the act (13) of the aforementioned embodiment, but a difference is that the pattern of the shielding conductive layer may include only a shielding electrode 50 disposed in the display region 100, as shown in FIG. 19.

Figure 20:
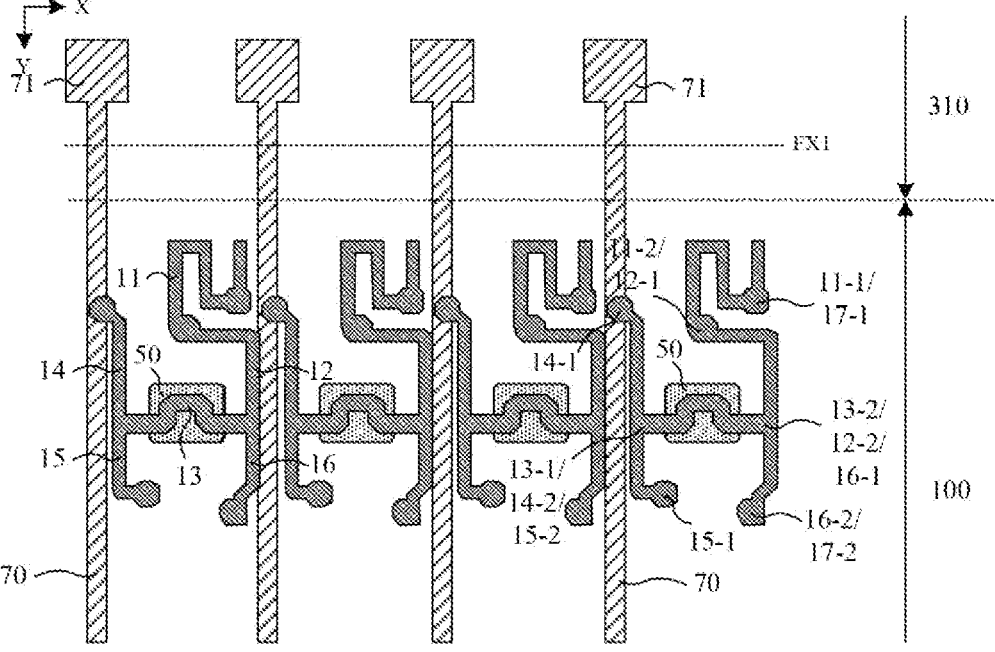
FIG. 20 is a schematic diagram of another display substrate after a semiconductor layer is formed according to the present disclosure.

(23) A pattern of a semiconductor layer is formed. In an exemplary implementation mode, a process of forming the pattern of the semiconductor layer may be substantially the same as the act (14) of the aforementioned embodiment, and a structure of a formed semiconductor layer may be substantially the same as that in the aforementioned embodiment, as shown in FIG. 20.

Figure 21:
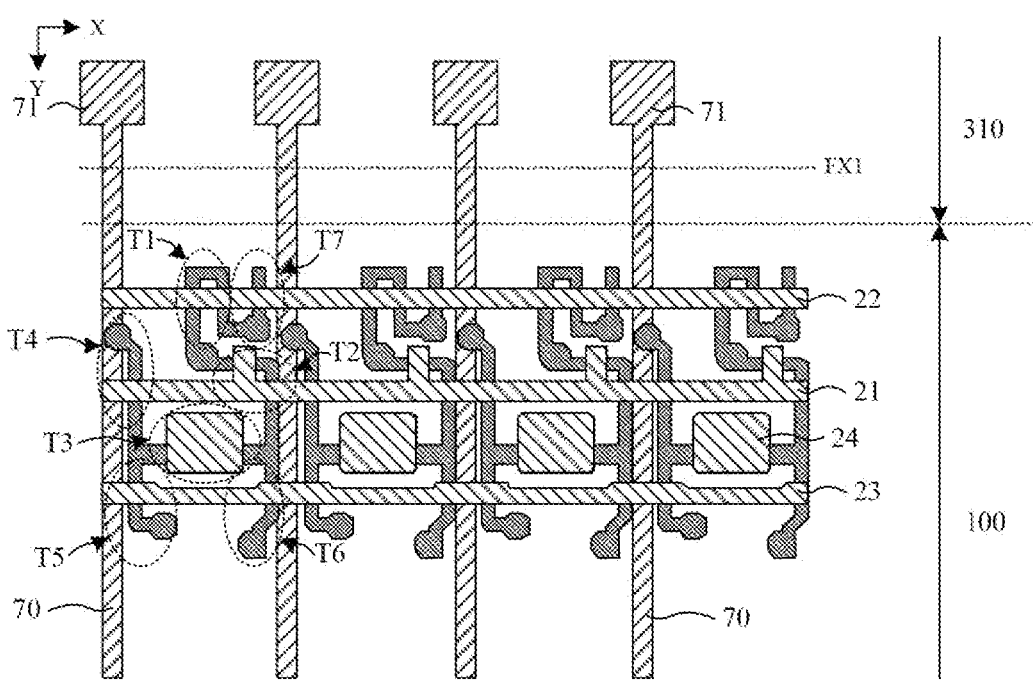
FIG. 21 is a schematic diagram of another display substrate after a first conductive layer is formed according to the present disclosure.

(24) A pattern of a first conductive layer is formed. In an exemplary implementation mode, a process of forming the pattern of the first conductive layer may be substantially the same as the act (15) of the aforementioned embodiment, and a structure of a formed first conductive layer may be substantially the same as that in the aforementioned embodiment, as shown in FIG. 21.

Figure 22:
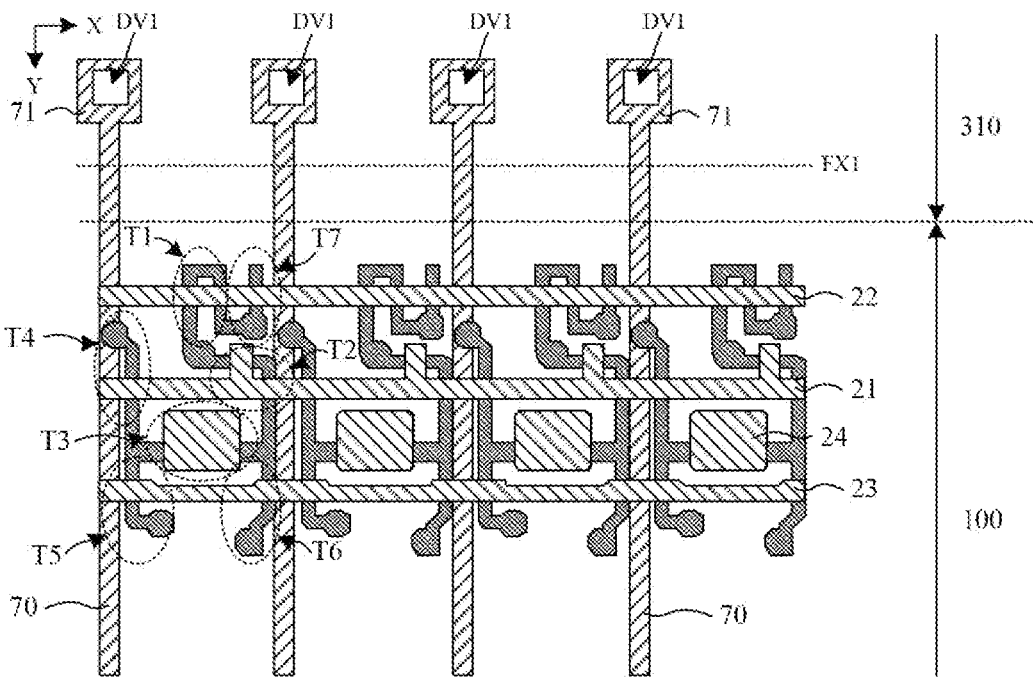
FIG. 22 is a schematic diagram of another display substrate after a first lapping via is formed according to the present disclosure.

(25) A pattern of a first lapping via is formed. In an exemplary implementation mode, forming the pattern of the first lapping via may include: on the base substrate on which the aforementioned patterns are formed, a third insulation thin film is deposited, and the third insulation thin film is patterned through a patterning process to form a third insulation layer covering the first conductive layer. A plurality of first lapping vias DV1 are provided on the third insulation layer, a plurality of first lapping vias DV1 may be disposed in a non-encapsulation region within the upper bezel region 310. An orthographic projection of a first lapping via DV1 on the base substrate may be within a range of an orthographic projection of the first connection block 71 on the base substrate. The third insulation layer, the second insulation layer, the first insulation layer, the second barrier layer, and the second flexible layer within the first lapping via DV1 are removed to expose a surface of the first connection block 71, and the first lapping via DV1 is configured such that a second connection line formed subsequently is connected with the first connection line 70 through the via, as shown in FIG. 22.

Figure 23:
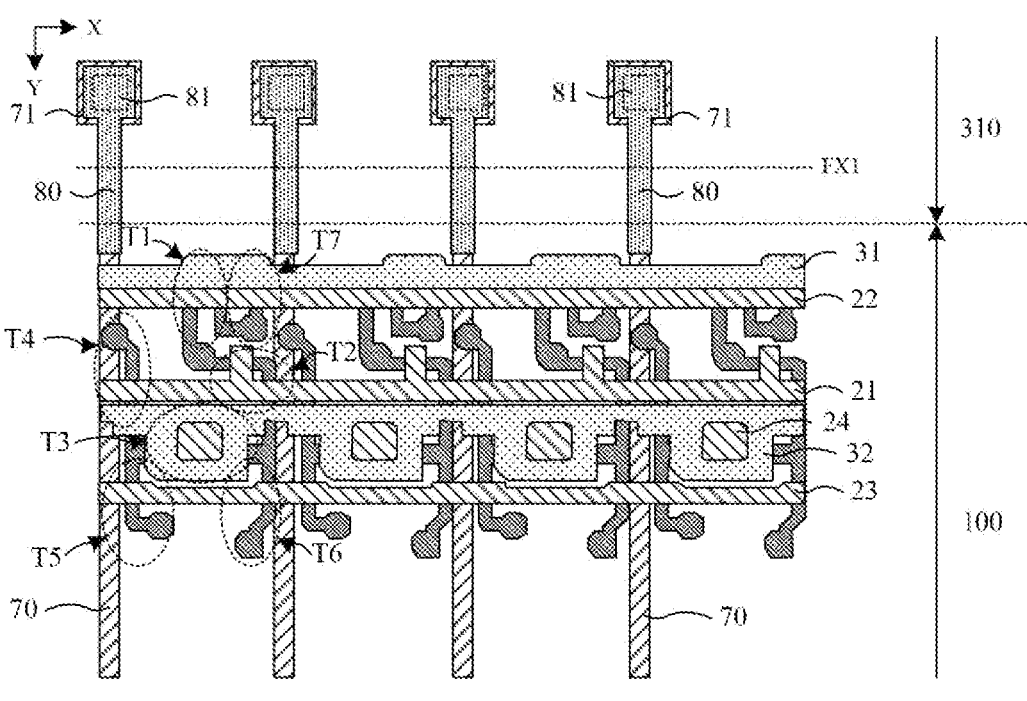
FIG. 23 is a schematic diagram of another display substrate after a second conductive layer is formed according to the present disclosure.

(26) A pattern of a second conductive layer is formed. In an exemplary implementation mode, a process of forming the pattern of the second conductive layer may be substantially the same as the act (16) of the aforementioned embodiment, the pattern of the second conductive layer includes not only an initial signal line 31, a second electrode plate 32 of a storage capacitor, and an electrode plate connection line 33, but also a second connection line 80, as shown in FIG. 23.

In an exemplary implementation mode, a structure of the initial signal line 31, the second electrode plate 32, and the electrode plate connection line 33 of this embodiment is substantially the same as that in the aforementioned embodiment.

In an exemplary implementation mode, a shape of the second connection line 80 may be a line shape of which a main body portion extends along a second direction Y. An end of the second connection line 80 away from the display region 100 (a first end of the second connection line 80) is provided with a second connection block 81, the second connection block 81 may be in a rectangular shape, and the second connection block 81 is connected with the first connection block 71 through the first lapping via DV1. A second end of the second connection line 80 extends to the display region 100 and the second end of the second connection line 80 is configured to be connected with a data signal line formed subsequently.

Figure 24:
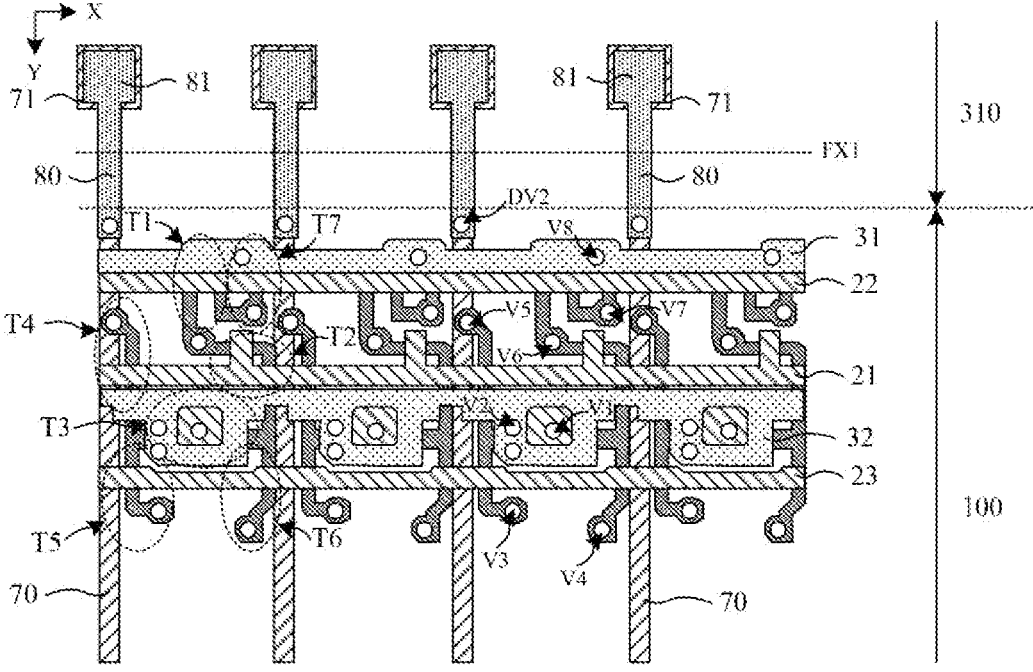
FIG. 24 is a schematic diagram of another display substrate after a fourth insulation layer is formed according to the present disclosure.

(27) A pattern of a fourth insulation layer is formed. In an exemplary implementation mode, a process of forming the pattern of the fourth insulation layer may be substantially the same as the act (17) of the aforementioned embodiment. A plurality of vias are disposed on the fourth insulation layer, a structure of the plurality of vias may be substantially the same as that in the aforementioned embodiment, but a difference is that the fourth insulation layer within the second lapping via DV2 is etched away to expose a surface of the second end of the second connection line 80, and the second lapping via DV2 is configured such that the data signal line subsequently formed is connected with the second connection line 80 through this via, as shown in FIG. 24.

In an exemplary implementation mode, an orthographic projection of the second lapping via DV2 on the base substrate is not overlapped with an orthographic projection of the first lapping via DV1 on the base substrate.

(28) A pattern of a third conductive layer is formed. In an exemplary implementation mode, a process of forming the pattern of the third conductive layer may be substantially the same as the act (18) of the aforementioned embodiment, and a structure of a formed third conductive layer may be substantially the same as that in the aforementioned embodiment, as shown in FIG. 17.

In the display substrate provided by the exemplary embodiment of the present disclosure, by disposing a first lapping via connecting a first connection line and a second connection line on a side of a first encapsulation line away from a display region, i.e., disposing a lapping point outside an encapsulation region, not only encapsulation failure caused by the first lapping via may be avoided and a design risk may be reduced, but also difficulties of an encapsulation process may be effectively reduced and a reliability risk of encapsulation may be reduced, thus process quality and product quality are improved to a maximum extent.

Figure 25:
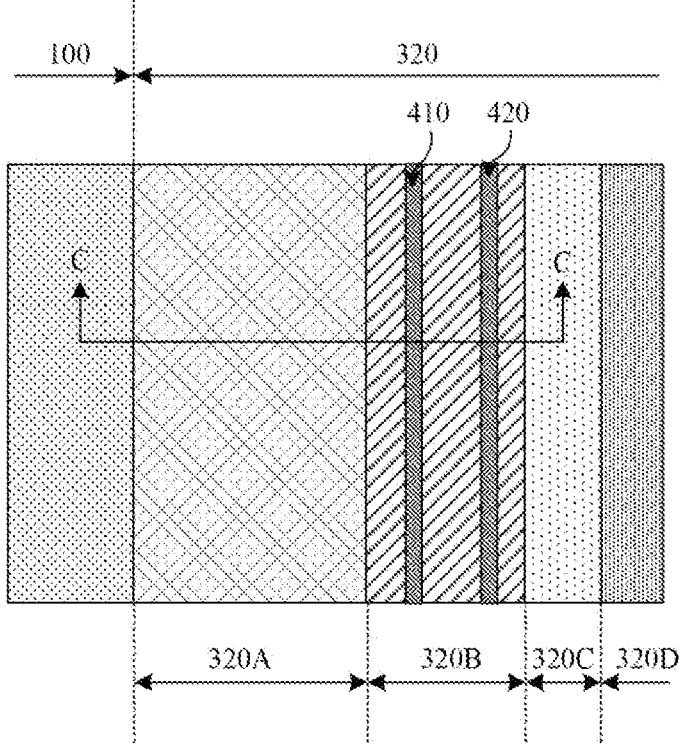
FIG. 25 is a schematic diagram of a planar structure of a side bezel region according to an exemplary embodiment of the present disclosure.

FIG. 25 is a schematic diagram of a planar structure of a side bezel region according to an exemplary embodiment of the present disclosure. As shown in FIG. 25, on a plane parallel to a display substrate, the side bezel region 320 may include a circuit region 320A, a power supply line region 320B, a crack dam region 320C, and a cutting region 320D that are sequentially disposed along a direction away from a display region 100. The circuit region 320A is connected to the display region 100 and may at least include a gate drive circuit, and the gate drive circuit is connected with a first scan signal line, a second scan signal line, and a light emitting control line of a pixel drive circuit in the display region 100. The power supply line region 320B is connected to the circuit region 320A and may at least include a bezel power supply line which may be connected with a cathode of a light emitting structure layer in the display region 100 through a plurality of bezel lapping electrodes. The crack dam region 320C is connected to the power supply line region 320B and may at least include a plurality of cracks disposed on a composite insulation layer to form a crack dam, and the crack dam is configured to reduce stress on the display region 100 and the circuit region 320A in a cutting process and to intercept transmission of a crack to a direction of the display region 100. The cutting region 320D is connected to the crack dam region 320C and may at least include a cutting groove disposed on the composite insulation layer, and the cutting groove is configured such that a cutting device respectively cuts along the cutting groove after preparation of all film layers of the display substrate is completed.

In an exemplary implementation mode, the power supply line region 320B in the side bezel region 320 may further be provided with a first isolation dam 410 and a second isolation dam 420, the first isolation dam 410 and the second isolation dam 420 may extend along a direction parallel to an edge of the display region, and a distance between the second isolation dam 420 and the edge of the display region is greater than a distance between the first isolation dam 410 and the edge of the display region.

Figure 26:
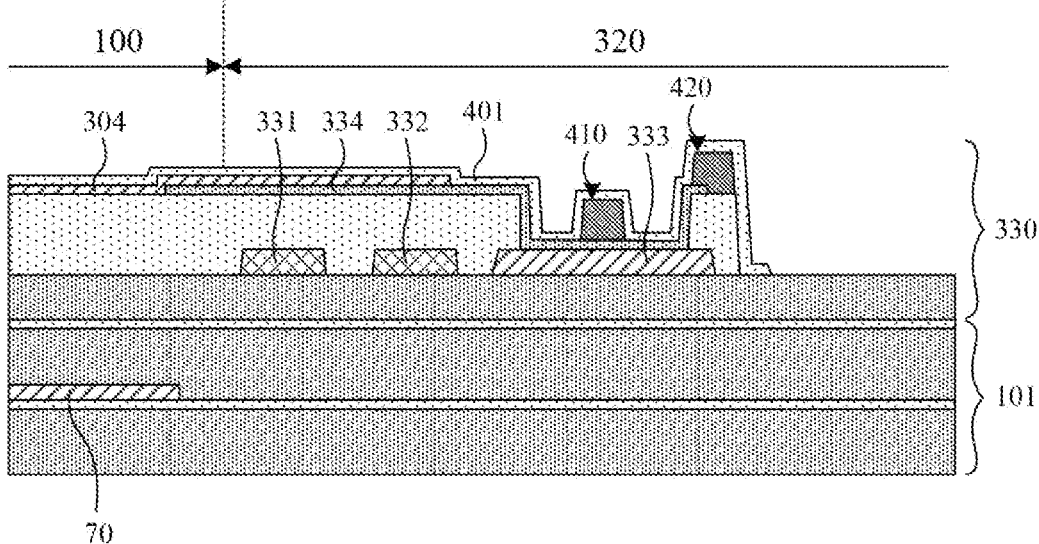
FIG. 26 is a schematic diagram of a sectional structure of a side bezel region according to an exemplary embodiment of the present disclosure.

FIG. 26 is a schematic diagram of a sectional structure of a side bezel region according to an exemplary embodiment of the present disclosure, and is a cross-sectional view taken along a C-C direction in FIG. 25. As shown in FIG. 26, on a plane perpendicular to a display substrate, a side bezel region 320 of the display substrate may at least include a bezel structure layer 330 disposed on a base substrate 101.

In an exemplary implementation mode, the base substrate 101 of the side bezel region 320 may include a first flexible layer, a first barrier layer, a second flexible layer, and a second barrier layer stacked, and the side bezel region 320 does not have a base substrate conductive layer, and the base substrate conductive layer may be disposed in a display region 100.

In an exemplary implementation mode, a bezel structure layer 330 of the side bezel region 320 may at least include a first gate circuit 331, a second gate circuit 332, a bezel power supply trace 333, and a bezel lapping electrode 334. The first gate circuit 331 and the second gate circuit 332 may include a plurality of transistors and storage capacitors, and the first gate circuit 331 and the second gate circuit 332 are connected with a first scan signal line, a second scan signal line, and a light emitting control line of the display region, and are configured to provide a scan signal and a light emitting control signal to a pixel drive circuit of the display region. The bezel lapping electrode 334 is lapped with the bezel power supply trace 333, and a cathode 304 of the display region 100 extends to the side bezel region 320 and then is lapped with the bezel lapping electrode 334, thereby achieving a connection between the cathode 304 of the display region and the bezel power supply trace 333 of the side bezel region 320.

In an exemplary implementation mode, the first gate circuit 331 and the second gate circuit 332 of the side bezel region 320 and the pixel drive circuit of the display region 100 may be formed synchronously through a same patterning process, and the bezel lapping electrode 334 and an anode of the display region may be disposed in a same layer and formed synchronously through a same patterning process.

In an exemplary implementation mode, the bezel structure layer 330 of the side bezel region 320 may further include a first isolation dam 410, a second isolation dam 420, and a first encapsulation layer 401, and the first encapsulation layer 401 covers the first isolation dam 410 and the second isolation dam 420.

Figure 27:
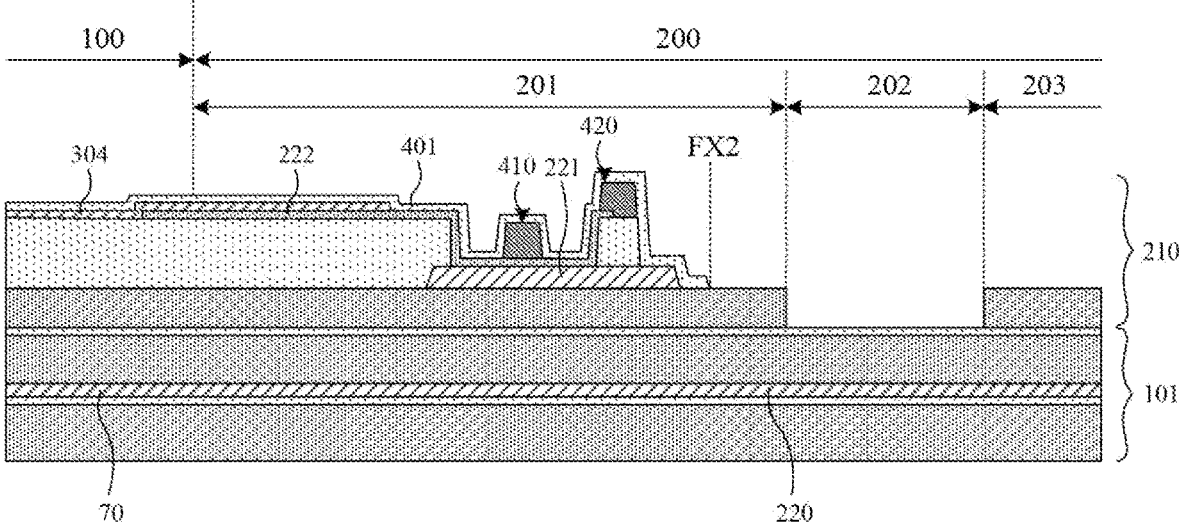
FIG. 27 and FIG. 28 are schematic diagrams of a sectional structure of a bonding region according to an exemplary embodiment of the present disclosure.
Figure 28:
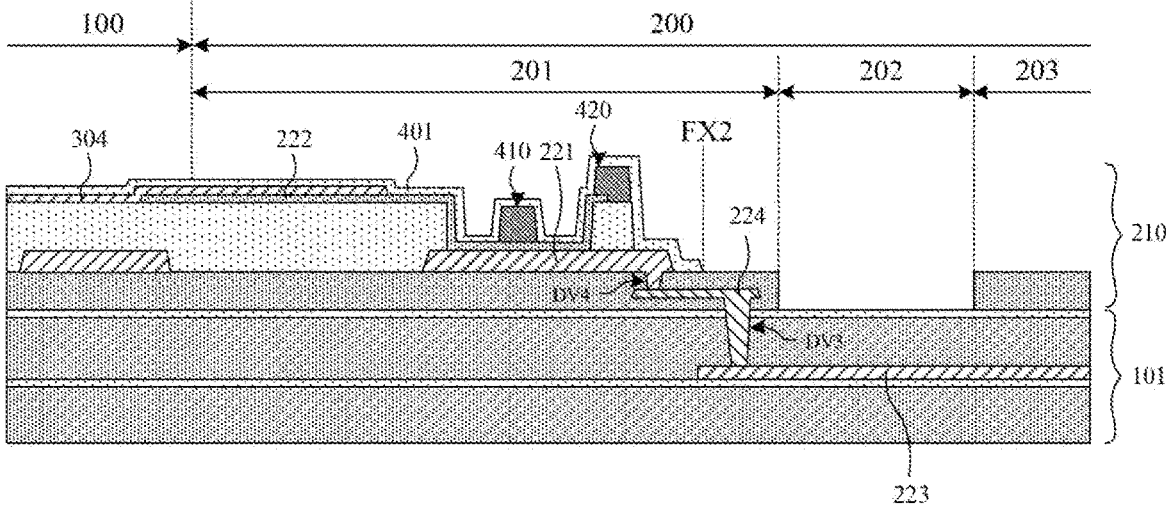

FIG. 27 and FIG. 28 are schematic diagrams of a sectional structure of a bonding region according to an exemplary embodiment of the present disclosure, FIG. 27 illustrates a sectional structure of a position where a leading-out line is located, and FIG. 28 illustrates a sectional structure of a position where a bonding power supply trace is located. In an exemplary implementation mode, a bonding region 200 may at least include a leading-out line region 201, a bending region 202, and a drive chip region 203 that are disposed sequentially along a direction away from a display region 100. The leading-out line region 201 is connected to the display region 100 and may at least include a plurality of leading-out lines 220 and a bonding power supply trace 221. A leading-out line 220 and a first connection line 70 may be connected with each other to form an integral structure. The bending region 202 is connected to the leading-out line region 201 and may include a composite insulation layer provided with a groove, and the groove is configured to enable the bonding region to be bent to a back surface of the display region. The drive chip region 203 may at least include an integrated circuit and a bonding pin, the integrated circuit is configured to be connected with the plurality of leading-out lines 220, and the bonding pin is configured to be bonded and connected with an external flexible circuit board.

In an exemplary implementation mode, the bonding region 200 may include a second encapsulation region and a second non-encapsulation region divided by a second encapsulation line FX2, the second encapsulation region and the second non-encapsulation region may be sequentially disposed along a direction away from the display region 100, a side of the second encapsulation line FX2 close to the display region 100 is the second encapsulation region, and a side of the second encapsulation line FX2 away from the display region 100 is the second non-encapsulation region. In an exemplary implementation mode, a boundary of a first encapsulation layer 401 away from the display region 100 forms the second encapsulation line FX2, and the second encapsulation line FX2 may be referred to as a CVD boundary.

In an exemplary implementation mode, on a plane perpendicular to a display substrate, the bonding region 200 of the display substrate may at least include a bonding structure layer 210 disposed on a base substrate 101.

As shown in FIG. 27, in an exemplary implementation mode, the base substrate 101 may include a first flexible layer, a first barrier layer, a base substrate conductive layer, a second flexible layer, and a second barrier layer that are stacked. The base substrate conductive layer may at least include a first connection line 70 and a leading-out line 220 in an integral structure, that is, a leading-out line 220 (a first connection line 70) directly enters the display region 100 from the drive chip region 203 across the bending region 202 and the leading-out line region 201. In the present disclosure, by disposing a leading-out line in the base substrate conductive layer, a bending radius of the bonding region may be effectively reduced, which is beneficial to reducing a width of a lower bezel.

In an exemplary implementation mode, the bonding structure layer 210 of the bonding region 200 may at least include a bonding power supply trace 221 and a bonding lapping electrode 222. The bonding lapping electrode 222 is lapped with the bonding power supply trace 221, and a cathode 304 of the display region 100 extends to the bonding region 200 and then is lapped with the bonding lapping electrode 222, thereby achieving a connection between the cathode 304 of the display region and the bonding power supply trace 221 of the bonding region 200.

In an exemplary implementation mode, the bonding power supply trace 221 of the bonding region 200 and the bezel power supply trace 333 of the side bezel region 320 may be disposed in a same layer and formed synchronously through a same patterning process. The bonding lapping electrode 222 of the bonding region 200 and an anode of the display region may be disposed in a same layer and formed synchronously through a same patterning process.

In an exemplary implementation mode, the bonding structure layer 210 of the bonding region 200 may further include a first isolation dam 410 and a second isolation dam 420, and the first isolation dam and the second isolation dam of the bonding region 200, the upper bezel region 310, and the side bezel region 320 may be connected with each other to form an annular structure around the display region 100.

As shown in FIG. 28, in an exemplary implementation mode, the base substrate conductive layer of the bonding region may further include a first power supply connection line 223, and the bonding structure layer 210 of the bonding region may further include a second power supply connection line 224. A first end of the first power supply connection line 223 is connected with a bonding pin, and a second end of the first power supply connection line 223 extends to the leading-out line region 201 from the drive chip region 203 across the bending region 202, and then is connected with the second power supply connection line 224 through a third lapping via DV3, and the second power supply connection line 224 is connected with the bonding power supply trace 221 through a fourth lapping via DV4.

In an exemplary implementation mode, the third lapping via DV3 may be disposed in the second non-encapsulation region of the bonding region 200, that is, the third lapping via DV3 may be disposed on a side of the second encapsulation line FX2 away from the display region 100.

In an exemplary implementation mode, the first power supply connection line 223 may be disposed in the base substrate conductive layer of the base substrate 101, the second power supply connection line 224 may be disposed in a shielding conductive layer of the bonding structure layer 210; or, the second power supply connection line 224 may be disposed in a first gate metal layer (GATE1) of the bonding structure layer 210; or, the second power supply connection line 224 may be disposed in a second gate metal layer (GATE2) of the bonding structure layer 210.

In the present disclosure, the third lapping via DV3 connecting the first power supply connection line 223 and the second power supply connection line 224 is disposed outside an encapsulation region, not only encapsulation failure caused by the third lapping via may be avoided and a design risk may be reduced, but also difficulties of an encapsulation process may be effectively reduced and a reliability risk of encapsulation may be reduced, thus process quality and product quality are improved to a maximum extent.

A structure shown in the present disclosure and a preparation process thereof are merely for exemplary description. In an exemplary implementation mode, a corresponding structure may be changed and patterning processes may be added or reduced according to actual needs, which is not limited in the present disclosure.

In an exemplary implementation mode, the display substrate according to the present disclosure may be applied to another display apparatus having a pixel drive circuit, such as quantum dot display, which is not limited in the present disclosure.

The present disclosure also provides a preparation method of a display substrate, for preparing the display substrate according to the aforementioned embodiments. In an exemplary implementation mode, the display substrate includes a display region, a bonding region located on a side of the display region in a second direction, and a bezel region located on another side of the display region. The bezel region at least includes an upper bezel region located on a side of the display region away from the bonding region and a side bezel region located on at least one side of the display region in a first direction, wherein the first direction intersects with the second direction. The preparation method includes: forming a base substrate, wherein the base substrate at least includes a first flexible layer, a second flexible layer, and a base substrate conductive layer disposed between the first flexible layer and the second flexible layer, the base substrate conductive layer at least includes a first connection line; and forming a drive circuit layer on the base substrate, wherein the drive circuit layer at least includes a second connection line and a data signal line, the second connection line is connected with the first connection line through a first lapping via, the data signal line is connected with the second connection line through a second lapping via, and the first lapping via is disposed in the upper bezel region.

The present disclosure also provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present disclosure are not limited thereto.

Although implementation modes disclosed in the present disclosure are described as above, the described contents are only implementation modes which are used for facilitating understanding of the present disclosure, but are not intended to limit the present disclosure. Any skilled person in the art to which the present disclosure pertains may make any modification and variation in forms and details of implementation without departing from the spirit and scope of the present disclosure. However, the patent protection scope of the present disclosure should be subject to the scope defined in the appended claims.

The invention claimed is:

1. A display substrate, comprising a display region, a bonding region located on a side of the display region in a second direction, and a bezel region located on another side of the display region, wherein the bezel region at least comprises an upper bezel region located on a side of the display region away from the bonding region and a side bezel region located on at least one side of the display region in a first direction, and the first direction intersects with the second direction; on a plane perpendicular to the display substrate, the display substrate comprises a base substrate and a drive circuit layer disposed on the base substrate, the base substrate at least comprises a first flexible layer, a second flexible layer, and a base substrate conductive layer disposed between the first flexible layer and the second flexible layer, the base substrate conductive layer at least comprises a first connection line, the drive circuit layer at least comprises a data signal line and a second connection line, the second connection line is connected with the first connection line through a first lapping via, the data signal line is connected with the second connection line through a second lapping via, and the first lapping via is disposed in the upper bezel region.

2. The display substrate according to claim 1, wherein the upper bezel region comprises a first encapsulation region and a first non-encapsulation region sequentially disposed along a direction away from the display region, and the first lapping via is disposed in the first non-encapsulation region.

3. The display substrate according to claim 2, wherein the bonding region at least comprises a leading-out line region, a bending region, and a drive chip region disposed sequentially along a direction away from the display region, the base substrate conductive layer further comprises a leading-out line, a first end of the leading-out line is connected with an integrated circuit of the drive chip region, and a second end of the leading-out line is connected with a first end of the first connection line after a second end of the leading-out line passes through the bending region and extends to the leading-out line region.

4. The display substrate according to claim 1, wherein the upper bezel region comprises an isolation region and a crack dam region disposed sequentially along a direction away from the display region, the isolation region is provided with an isolation dam, the crack dam region is provided with a crack dam, and the first lapping via is disposed between the isolation dam and the crack dam.

5. The display substrate according to claim 4, wherein the bonding region at least comprises a leading-out line region, a bending region, and a drive chip region disposed sequentially along a direction away from the display region, the base substrate conductive layer further comprises a leading-out line, a first end of the leading-out line is connected with an integrated circuit of the drive chip region, and a second end of the leading-out line is connected with a first end of the first connection line after a second end of the leading-out line passes through the bending region and extends to the leading-out line region.

6. The display substrate according to claim 1, wherein the drive circuit layer at least comprises a shielding conductive layer, a first conductive layer, a second conductive layer, and a third conductive layer disposed sequentially on the base substrate, and the second connection line and the data signal line are disposed in different conductive layers.

7. The display substrate according to claim 6, wherein the bonding region at least comprises a leading-out line region, a bending region, and a drive chip region disposed sequentially along a direction away from the display region, the base substrate conductive layer further comprises a leading-out line, a first end of the leading-out line is connected with an integrated circuit of the drive chip region, and a second end of the leading-out line is connected with a first end of the first connection line after a second end of the leading-out line passes through the bending region and extends to the leading-out line region.

8. The display substrate according to claim 6, wherein the data signal line is disposed in the third conductive layer; the second connection line is disposed in the shielding conductive layer, or the second connection line is disposed in the first conductive layer, or the second connection line is disposed in the second conductive layer.

9. The display substrate according to claim 1, wherein a first end of the first connection line is connected with a leading-out line of the bonding region, and a second end of the first connection line is connected with a first end of the second connection line through the first lapping via after the second end of the first connection line passes through the display region and extends to the upper bezel region.

10. The display substrate according to claim 9, wherein an end of the first connection line away from the display region is provided with a first connection block, and an orthographic projection of the first lapping via on the base substrate is at least partially overlapped with an orthographic projection of the first connection block on the base substrate.

11. The display substrate according to claim 9, wherein a first end of the second connection line is connected with the second end of the first connection line through the first lapping via, and a second end of the second connection line is connected with the data signal line through the second lapping via after the second end of the second connection line extends to the display region.

12. The display substrate according to claim 11, wherein an end of the second connection line away from the display region is provided with a second connection block, and an orthographic projection of the first lapping via on the base substrate is at least partially overlapped with an orthographic projection of the second connection block on the base substrate.

13. The display substrate according to claim 1, wherein an orthographic projection of the first lapping via on the base substrate is not overlapped with an orthographic projection of the second lapping via on the base substrate.

14. The display substrate according to claim 1, wherein the bonding region at least comprises a leading-out line region, a bending region, and a drive chip region disposed sequentially along a direction away from the display region, the base substrate conductive layer further comprises a leading-out line, a first end of the leading-out line is connected with an integrated circuit of the drive chip region, and a second end of the leading-out line is connected with a first end of the first connection line after a second end of the leading-out line passes through the bending region and extends to the leading-out line region.

15. The display substrate according to claim 14, wherein the leading-out line and the first connection line are connected with each other to form an integral structure.

16. The display substrate according to claim 14, wherein the base substrate conductive layer further comprises a first power supply connection line, the leading-out line region further comprises a second power supply connection line and a power supply trace, a first end of the first power supply connection line is connected with a bonding pin of the drive chip region, a second end of the first power supply connection line is connected with the second power supply connection line through a third lapping via after the second end of the first power supply connection line passes through the bending region and extends to the leading-out line region, and the second power supply connection line is connected with the power supply trace through a fourth lapping via.

17. The display substrate according to claim 16, wherein the leading-out line region comprises a second encapsulation region and a second non-encapsulation region that are sequentially disposed along a direction away from the display region, and the third lapping via is disposed in the second non-encapsulation region.

18. The display substrate according to claim 1, wherein an orthographic projection of the side bezel region on the base substrate is not overlapped with an orthographic projection of the base substrate conductive layer on the base substrate.

19. A display apparatus, comprising a display substrate according to claim 1.

20. A preparation method of a display substrate, wherein the display substrate comprises a display region, a bonding region located on a side of the display region in a second direction, and a bezel region located on another side of the display region, the bezel region at least comprises an upper bezel region located on a side of the display region away from the bonding region and a side bezel region located on at least one side of the display region in a first direction, and the first direction intersects with the second direction, the preparation method comprises:

forming a base substrate, wherein the base substrate at least comprises a first flexible layer, a second flexible layer, and a base substrate conductive layer disposed between the first flexible layer and the second flexible layer, the base substrate conductive layer at least comprises a first connection line; and forming a drive circuit layer on the base substrate, wherein the drive circuit layer at least comprises a data signal line and a second connection line, the second connection line is connected with the first connection line through a first lapping via, the data signal line is connected with the second connection line through a second lapping via, and the first lapping via is disposed in the upper bezel region.

* * * * *